(12) United States Patent
Kim et al.

(10) Patent No.: US 12,101,935 B2
(45) Date of Patent: Sep. 24, 2024

(54) SEMICONDUCTOR DEVICE AND MANUFACTURING METHOD OF SEMICONDUCTOR DEVICE

(71) Applicant: SK hynix Inc., Icheon-si Gyeonggi-do (KR)

(72) Inventors: Seo Hyun Kim, Icheon-si Gyeonggi-do (KR); In Ku Kang, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 511 days.

(21) Appl. No.: 17/408,149

(22) Filed: Aug. 20, 2021

(65) Prior Publication Data

US 2022/0293629 A1 Sep. 15, 2022

(30) Foreign Application Priority Data

Mar. 10, 2021 (KR) .................. 10-2021-0031663

(51) Int. Cl.
*H10B 43/27* (2023.01)
*H10B 41/27* (2023.01)
*H10B 63/00* (2023.01)

(52) U.S. Cl.
CPC ............ *H10B 43/27* (2023.02); *H10B 41/27* (2023.02); *H10B 63/34* (2023.02)

(58) Field of Classification Search
CPC ............ H01L 27/1244; H01L 27/1222; H01L 27/1288; H01L 27/1248; H01L 27/124; H01L 27/1259; H01L 29/78675; H01L 29/66757; H01L 29/66825; H01L 29/66833; H01L 29/788; H01L 29/792; H10B 43/27; H10B 43/40; H10B 43/50; H10B 43/10; H10B 41/27; H10B 41/40; H10B 41/50; H10B 41/10; H10B 63/34;
(Continued)

(56) References Cited

U.S. PATENT DOCUMENTS 10,665,603 B2 5/2020 Kim
2005/0239282 A1* 10/2005 Chen ................. H01L 21/76897
257/E21.507
(Continued)

FOREIGN PATENT DOCUMENTS

KR 1020210106293 A 8/2021

*Primary Examiner* — Sitaramarao S Yechuri
(74) *Attorney, Agent, or Firm* — WILLIAM PARK & ASSOCIATES LTD.

(57) ABSTRACT

A method of manufacturing a semiconductor device includes forming a stacked structure with first material layers and second material layers that are alternately stacked with each other, forming a first opening that passes through the stacked structure, forming second openings between the first material layers, forming first sacrificial layers in the second openings, forming first isolation layers that protrude into the first opening by oxidizing the first sacrificial layers, forming mold patterns on the first material layers between the protruding portions of the first isolation layers, forming third openings by etching portions of the first isolation layers that are exposed between the mold patterns, forming second sacrificial layers in the third openings, and forming second isolation layers that protrude farther toward the center of the first opening than the mold patterns by oxidizing the second sacrificial layers.

23 Claims, 21 Drawing Sheets

(58) Field of Classification Search
CPC ........ H10B 63/00; H10B 63/30; H10B 63/84; H10N 70/011
See application file for complete search history.

(56) References Cited

U.S. PATENT DOCUMENTS

| | | | |
|---|---|---|---|
| 2009/0061631 A1* | 3/2009 | Lee | H01L 29/7887 |
| | | | 257/E21.085 |
| 2015/0357413 A1* | 12/2015 | Zhang | H10B 43/27 |
| | | | 257/324 |
| 2017/0250189 A1* | 8/2017 | Itokawa | H10B 41/41 |
| 2019/0198510 A1* | 6/2019 | Kim | H10B 43/10 |

* cited by examiner

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2021-0031663 filed on Mar. 10, 2021, in the Korean Intellectual Property Office, the entire disclosure of which is incorporated by reference herein.

BACKGROUND

1. Technical Field

Various embodiments of the invention relate generally to an electronic device, and more particularly, to a semiconductor device and a method of manufacturing the semiconductor device.

2. Related Art

The degree of integration density of a semiconductor device may be determined mainly by an area of a unit memory cell. Recently, however, the increase in integration density of a semiconductor device in which memory cells are formed in a single layer over a substrate has been limited. Thus, three-dimensional semiconductor devices have been proposed in which memory cells are stacked over a substrate. In addition, to improve the operational reliability of these three-dimensional semiconductor devices, various structures and manufacturing methods have been developed.

SUMMARY

According to an embodiment, a method of manufacturing a semiconductor device may include forming a stacked structure with first material layers and second material layers that are alternately stacked with each other, forming a first opening that passes through the stacked structure, forming second openings between the first material layers, forming first sacrificial layers in the second openings, forming first isolation layers that protrude into the first opening by oxidizing the first sacrificial layers, forming mold patterns on the first material layers between the protruding portions of the first isolation layers, forming third openings by etching portions of the first isolation layers that are exposed between the mold patterns, forming second sacrificial layers in the third openings, and forming second isolation layers that protrude farther toward the center of the first opening than the mold patterns by oxidizing the second sacrificial layers.

According to an embodiment, a method of manufacturing a semiconductor device may include forming a stacked structure with first material layers and second material layers that are alternately stacked with each other, forming a first opening that passes through the stacked structure, forming first isolation layers on the second material layers, the first isolation layers protruding into the first opening, forming mold patterns on the first material layers, protruding toward a center of the first opening, between the protruding portions of the first isolation layers, forming third openings by partially etching the first isolation layers that are exposed between the mold patterns, forming second isolation layers in the third openings, the second isolation layers including first curved surfaces that protrude toward the mold patterns and second curved surfaces that protrude farther towards a center of the first opening than the mold patterns, removing the mold patterns, and forming memory patterns between the second isolation layers, sidewalls of the memory patterns facing portions of the first curved surfaces and the second curved surfaces of the second isolation layers.

According to an embodiment, a semiconductor device may include a gate structure including conductive layers and insulating layers that are alternately stacked with each other, a channel layer passing through the gate structure, blocking patterns located between the channel layer and the conductive layers, memory patterns located between the channel layer and the blocking patterns, and isolation layers located between the channel layer and the insulating layers, each of the isolation layers including a first area with a first curved surface and a second area with a second curved surface, wherein the second area has a smaller width than the first area, and wherein at least a portion of the second area protrudes farther toward the channel layer than the memory patterns.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments are directed to a semiconductor device with a stabilized structure and improved characteristics, and a method of manufacturing the semiconductor device.

Figure 1A:
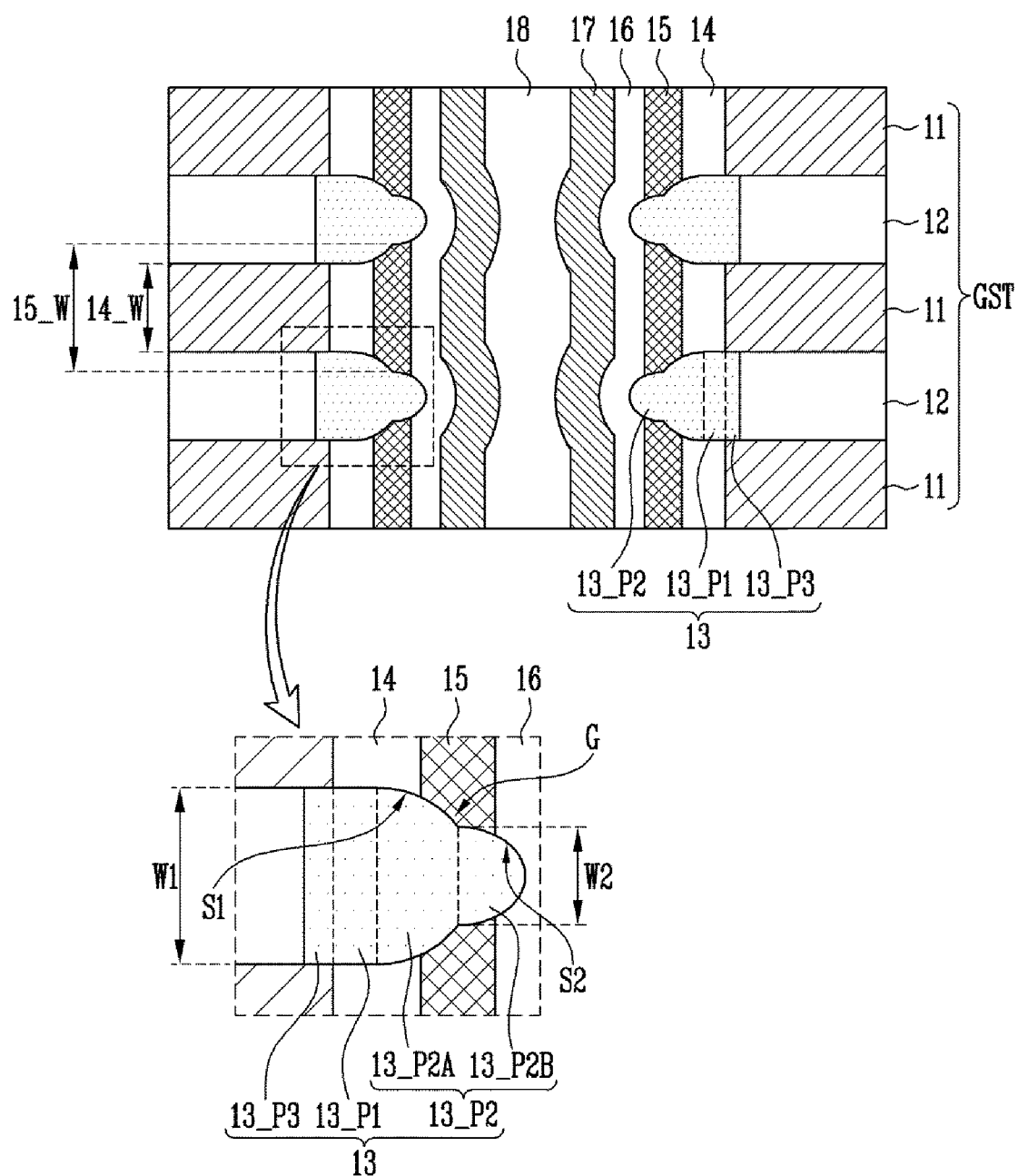
FIGS. 1A to 1C are diagrams illustrating the structure of a semiconductor device according to an embodiment of the present disclosure.
Figure 1B:
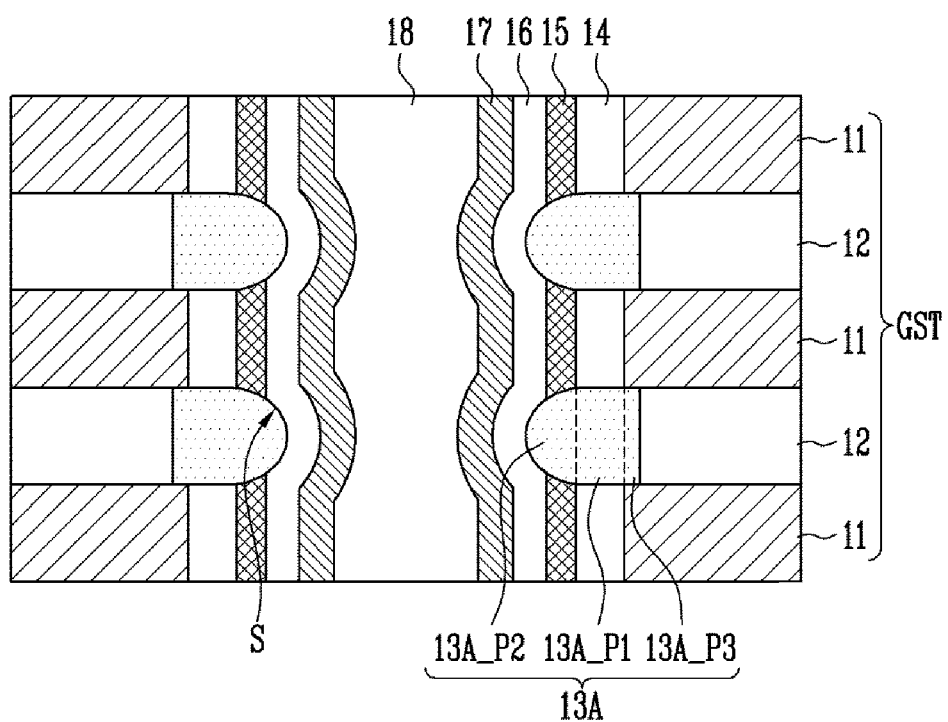
Figure 1C:
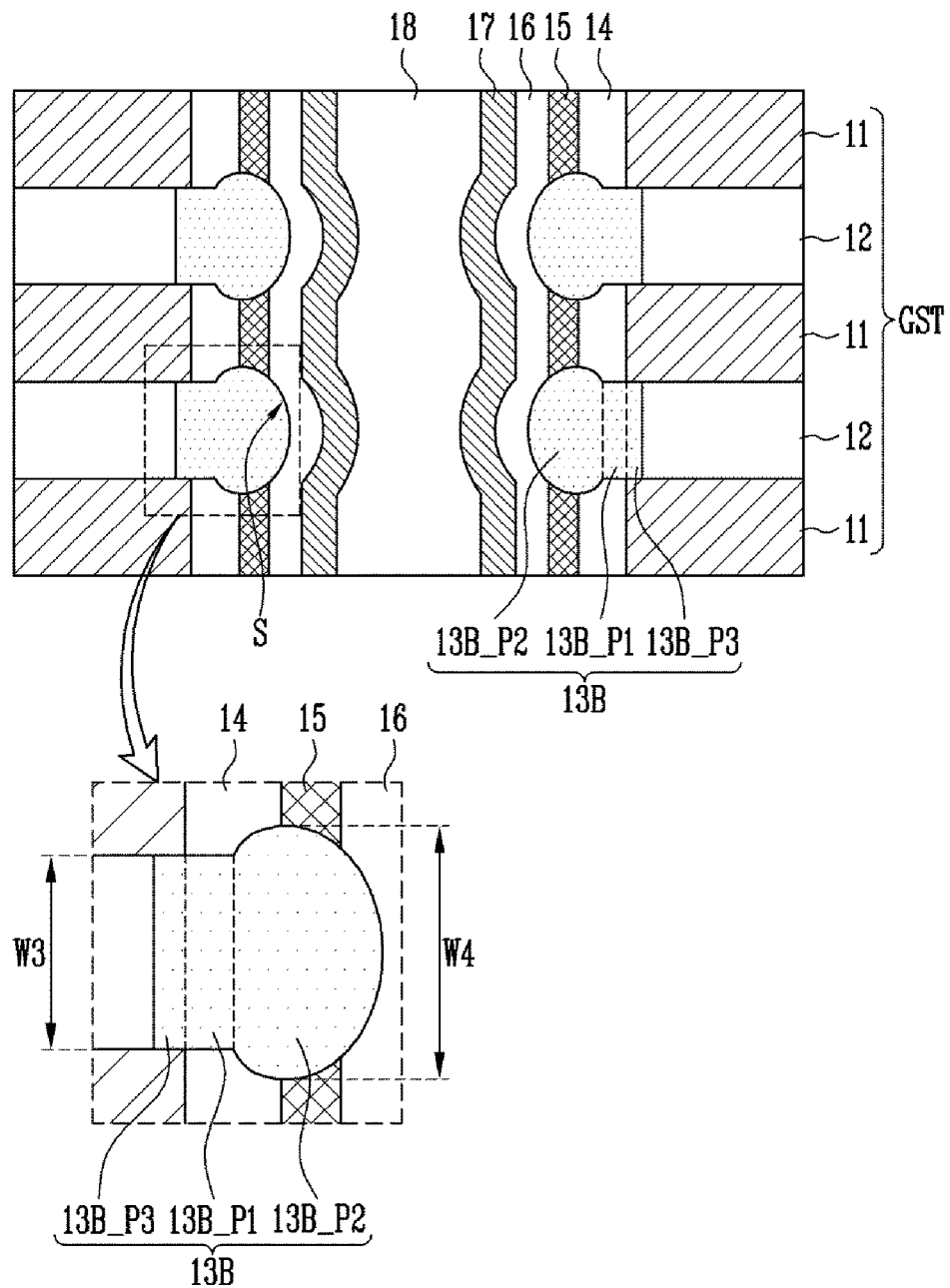

FIGS. 1A to 1C are diagrams illustrating the structure of a semiconductor device according to an embodiment of the present disclosure.

Referring to FIG. 1A, a semiconductor device may include a gate structure GST, a channel layer 17, blocking patterns 14, memory patterns 15, and isolation layers 13.

The semiconductor device may further include a tunnel insulating layer 16, a core 18, or a combination thereof.

The gate structure GST may include conductive layers 11 and insulating layers 12 that are alternately stacked with each other. Each of the conductive layers 11 may be a gate electrode of a memory cell or a select transistor. The conductive layers 11 may include a conductive material such as polysilicon, tungsten, molybdenum, or metal. The insulating layers 12 may insulate the stacked conductive layers 11 from each other. The insulating layers 12 may include an insulating material such as oxides, nitrides, or air gaps.

The channel layer 17 may pass through the gate structure GST. The channel layer 17 may extend in a direction in which the conductive layers 11 and the insulating layers 12 are alternately stacked with each other. A channel may be formed in a memory cell, a select transistor, and the like in the channel layer 17. The channel layer 17 may include a semiconductor material. According to an embodiment, the channel layer 17 may include silicon, germanium or a nanostructure. However, the semiconductor device may include a conductive layer instead of the channel layer 17. For example, the conductive layer may be an electrode layer or a vertical bit line.

The blocking patterns 14 may be interposed between the channel layer 17 and the conductive layers 11. The blocking patterns 14 may include a high-k dielectric material. Each of the blocking patterns 14 may include a width 14_W. The width 14_W may be the maximum width of the blocking pattern 14.

The memory patterns 15 may be interposed between the channel layer 17 and the blocking patterns 14, respectively. The memory patterns 15 may include a floating gate, a charge trapping material, polysilicon, a nitride, a variable resistance material, a phase change material, or a combination thereof. Each of the memory patterns 15 may have a width 15_W. The width 15_W may be the maximum width of each of the memory patterns 15. The width 14_W and the width 15_W may have substantially the same width or may have different widths. According to an embodiment, the width 15_W may be greater than the width 14_W.

The isolation layers 13 may be interposed between the channel layer 17 and the insulating layers 12, respectively. Each of the isolation layers 13 may include a first portion 13_P1, a second portion 13_P2, and a third portion 13_P3. The first portion 13_P1 may be located between the second portion 13_P2 and the third portion 13_P3.

The first portion 13_P1 may be located between the blocking patterns 14. The first portion 13_P1 may include a first width W1. The first portion 13_P1 may have uniform width.

The second portion 13_P2 may be located between the blocking patterns 14, or between the memory patterns 15. At least a portion of the second portion 13_P2 may protrude farther toward the channel layer 17 than the memory patterns 15. At least a portion of the second portion 13_P2 may protrude into the tunnel insulating layer 16. The width of the second portion 13_P2 may be substantially the same as or smaller than that of the first portion 13_P1.

The second portion 13_P2 may include a first area 13_P2A with a first curved surface S1 and a second area 13_P2B with a second curved surface S2. The width of the second area 13_P2B may be substantially the same as or smaller than that of the first area 13_P2A. The second area 13_P2B may have a second width W2 that is smaller than the first width W1. The second width W2 may be the maximum width of the second area 13_P2B. The first area 13_P2A may have a width that is greater than the second width W2 and may be less than the first width W1.

The first area 13_P2A may include a sidewall that faces the blocking pattern 14 or the memory pattern 15. In addition, at least a portion of the sidewall of the first area 13_P2A may include the first curved surface S1. The second area 13_P2B may include a surface that faces the memory pattern 15 or the tunnel insulating layer 16. In addition, at least a portion of the surface of the second area 13_P2B may include the second curved surface S2. Each of the blocking patterns 14 may face the first curved surface S1. Each of the memory patterns 15 may face the first curved surface S1 and the second curved surface S2. Each of the memory patterns 15 may fill a groove G between the first curved surface S1 and the second curved surface S2.

The third portion 13_P3 may be located between the conductive layers 11. The third portion 13_P3 may include a flat sidewall that faces the conductive layer 11 and may protrude into the gate structure GST toward the insulating layers 12. The third portion 13_P3 may have substantially the same width as the first portion 13_P1.

The tunnel insulating layer 16 may surround a sidewall of the channel layer 17. The tunnel insulating layer 16 may be located between the channel layer 17 and the memory patterns 15 and between the channel layer 17 and the isolation layers 13. The tunnel insulating layer 16 may include a curved surface that surrounds the second portion 13_P2 that protrudes between the memory patterns 15. According to an embodiment, the tunnel insulating layer 16 may include a flat sidewall between the channel layer 17 and the conductive layers 11 and may include a curved sidewall between the channel layer 17 and the insulating layers 12. The profile of the tunnel insulating layer 16 may be transferred onto the channel layer 17. The channel layer 17 may include a curved surface that surrounds the second portion 13_P2 that protrudes between the memory patterns 15.

The core 18 may be formed in the channel layer 17. The core 18 may have a single-layer structure or a multilayer structure. The core 18 may include an insulating material, such as an oxide, a nitride, or an air gap. However, without forming the core 18, the channel layer 17 may have a completely filled central portion. Alternatively, an electrode layer or a vertical bit line may be formed in the core 18.

Referring to FIG. 1B, isolation layers 13A may be located between the channel layer 17 and the insulating layers 12, respectively. Each of the isolation layers 13A may include a first portion 13A_P1, a second portion 13A_P2, and a third portion 13A_P3. The first portion 13A_P1 may be located between the blocking patterns 14. The second portion 13A_P2 may include a curved surface S that faces the blocking patterns 14 and the memory patterns 15. At least a portion of the second portion 13A_P2 may protrude farther toward the channel layer 17 than the memory patterns 15. The third portion 13A_P3 may protrude into the gate structure GST toward the insulating layers 12. The other structures, as shown in FIG. 1B, may be similar to those described above with reference to FIG. 1A.

Referring to FIG. 1C, isolation layers 13B may be located between the channel layer 17 and the insulating layers 12. Each of the isolation layers 13B may include a first portion 13B_P1, a second portion 13B_P2, and a third portion 13B_P3. The first portion 13B_P1 may be located between the blocking patterns 14. The first portion 13B_P1 may include a third width W3. The third portion 13A_P3 may protrude into the gate structure GST toward the insulating layers 12.

The second portion 13B_P2 may be located between the blocking patterns 14 and between the memory patterns 15. The second portion 13A_P2 may include a curved surface S that faces the blocking patterns 14 and the memory patterns 15. At least a portion of the second portion 13B_P2 may protrude farther toward the channel layer 17 than the memory patterns 15. The second portion 13B_P2 may have a fourth width W4 greater than the third width W3. The fourth width W4 may be the maximum width of the second portion 13B_P2. The other structures, as shown in FIG. 1C, may be similar to those described above with reference to FIG. 1A.

According to the above-described structure, memory cells or select transistors may be located at intersections between the channel layer 17 and the conductive layers 11. A space area may be defined between the stacked memory cells, and the isolation layers 13 may be located in the space area. The memory patterns 15 of the stacked memory cells may be separated from each other by the isolation layers 13. Therefore, charge movements between the stacked memory cells may be prevented, and retention characteristics may be improved. Dispersion of an electric field into the space area may be prevented or minimized during a program operation, a read operation, or an erase operation, and the operating speed may be improved. In addition, by separating the memory patterns 15 from each other, capacitance may be reduced, and disturbance between the stacked memory cells may be reduced.

FIGS. 2A to 2L are diagrams illustrating a method of manufacturing a semiconductor device according to an embodiment of the present disclosure. Hereinafter, any repetitive detailed description of components already mentioned above will be omitted.

Figure 2A:
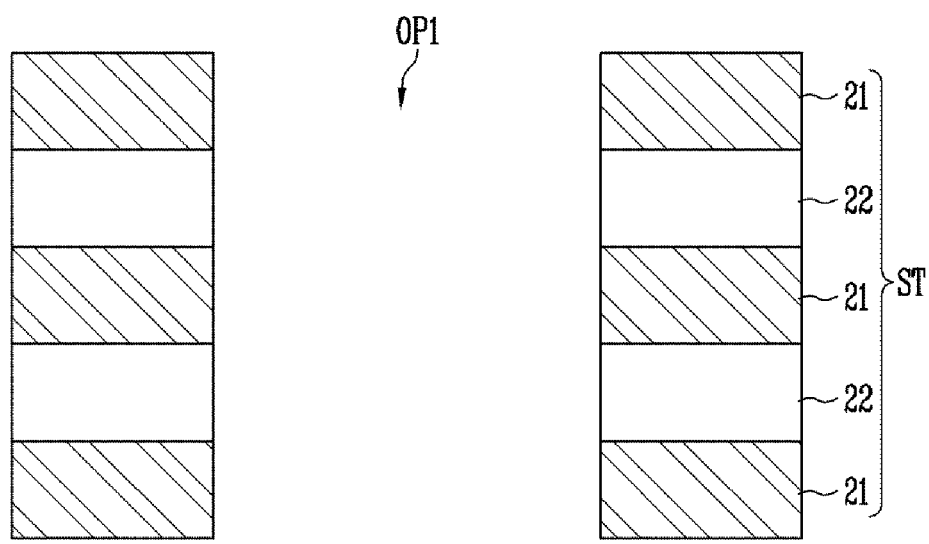
FIGS. 2A to 2L are diagrams illustrating a method of manufacturing a semiconductor device according to an embodiment of the present disclosure.

Referring to FIG. 2A, a stacked structure ST may be formed. The stacked structure ST may include first material layers 21 and second material layers 22 that are alternately stacked. The first material layers 21 may include a material with a high etch selectivity with respect to the second material layers 22. For example, the first material layers 21 may include a sacrificial material, such as a nitride, and the second material layers 22 may include an insulating material, such as an oxide. In another example, the first material layers 21 may include a conductive material, such as polysilicon, tungsten, or molybdenum, and the second material layers 22 may include an insulating material, such as an oxide.

Subsequently, a first opening OP1 may be formed through the stacked structure ST. The first opening OP1 may have a circular cross-section, an elliptical cross-section, a polygonal cross-section, or the like. According to an embodiment, a plurality of first openings OP1 may be arranged in a first direction and a second direction that crosses the first direction.

Figure 2B:
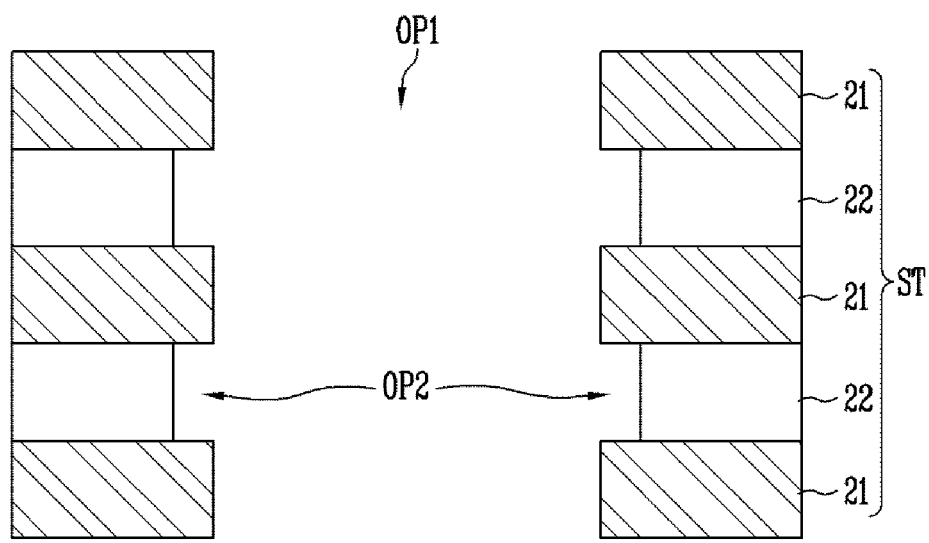

Referring to FIG. 2B, second openings OP2 may be formed between the first material layers 21. The second openings OP2 may be coupled to the first opening OP1. According to an embedment, the second openings OP2 may be formed by selectively etching the second material layers 22. The second material layers 22 may be etched by using a wet etch process. According to an embodiment, a first material may be selectively deposited on sidewalls of the first material layers 21 that are exposed through the first opening OP1. As a result, the first material layers 21 may protrude into the first opening OP1, and the second openings OP2 may be formed.

Figure 2C:
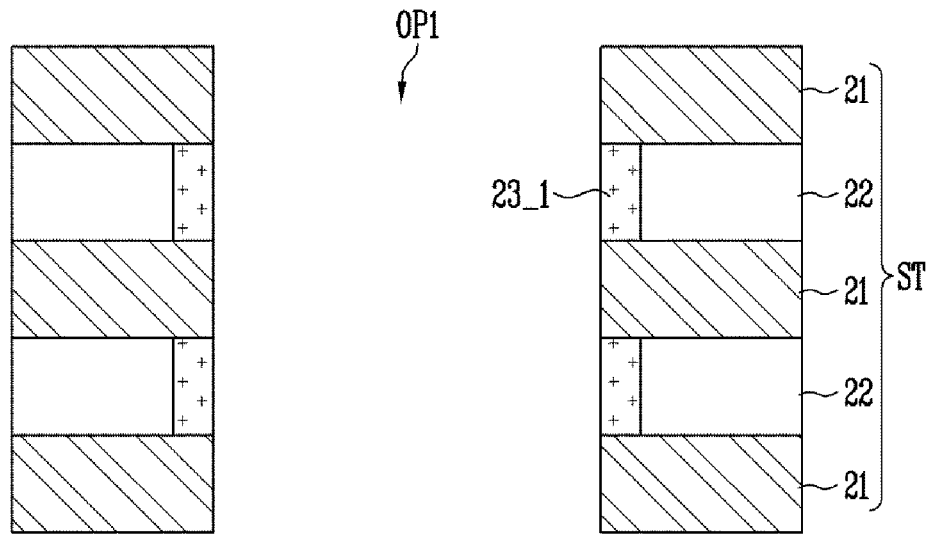

Referring to FIG. 2C, first sacrificial layers 23_1 may be formed in the second openings OP2. According to an embodiment, a first sacrificial material layer may be formed in the first opening OP1 and the second openings OP2. Subsequently, a portion of the first sacrificial material layer that is formed in the first opening OP1 may be etched. A wet or dry etch method may be used to etch the first sacrificial material layer. As a result, the first sacrificial layers 23_1 that are located in the second openings OP2, respectively, and are separated from each other may be formed. According to an embodiment, the first sacrificial layers 23_1 may include polysilicon.

Figure 2D:
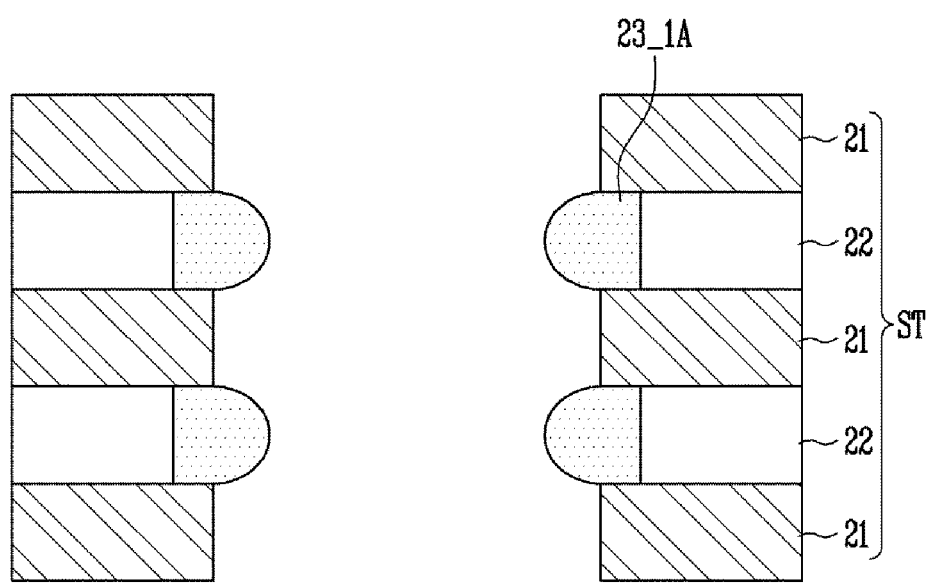

Referring to FIG. 2D, first isolation layers 23_1A that protrude into the first opening OP1 may be formed. The first isolation layers 23_1A may be located on the second material layers 22. According to an embodiment, the first isolation layers 23_1A may be formed by selectively oxidizing the first sacrificial layers 23_1. Wet oxidation may be carried out on the first sacrificial layers 23_1. The first isolation layers 23_1A may include an oxide. During the oxidation process, volume expansion may occur so that the first isolation layers 23_1A may protrude into the first opening OP1. Portions of the first isolation layers 23_1A that protrude into the first opening OP1 may include curved surfaces. In addition, by etching the first isolation layers 23_1A, the protruding portions of the first isolation layers 23_1A may be finished with curved edges.

Figure 2E:
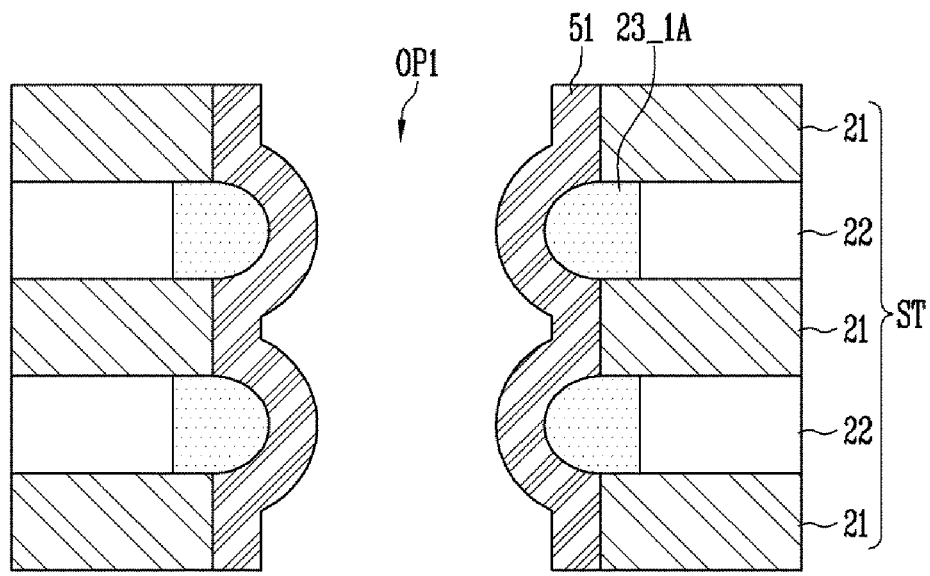

Referring to FIG. 2E, a mold layer 51 may be formed in the first opening OP1. The mold layer 51 may be formed on the sidewalls of the first material layers 21 and surfaces of the first isolation layers 23_1A. The mold layer 51 may include a material with etch selectivity with respect to the first isolation layers 23_1A. The first isolation layers 23_1A may include an oxide, and the mold layer 51 may include a nitride.

Figure 2F:
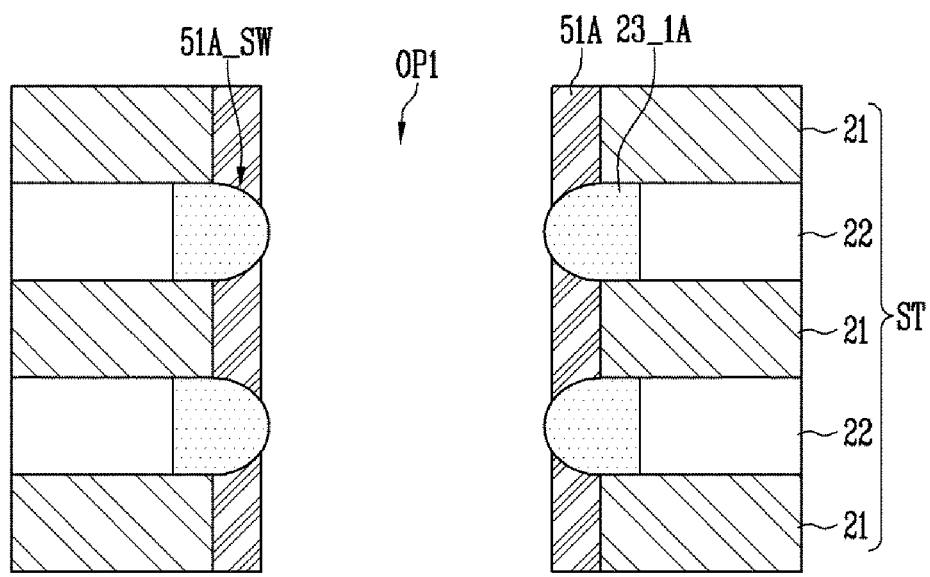

Referring to FIG. 2F, mold patterns 51A may be formed between the first isolation layers 23_1A. According to an embodiment, the mold patterns 51A may be formed by etching the mold layer 51. The mold layer 51 may be etched based on a wet etch method or a dry etch method. The mold patterns 51A may be separated from each other by the first isolation layers 23_1A. A portion of each of the mold patterns 51A that is adjacent to the first material layer 21 may have a greater width than a portion thereof that is distant from the first material layer 21. According to an embodiment, each of the mold patterns 51A may have a trapezoidal cross-section. Each of the mold patterns 51A may include a sidewall 51A_SW that faces the first isolation layer 23_A. The sidewall 51A_SW may include a curved surface. The curved surface of the sidewall 51A_SW may be defined by transferring the curved surface of the first isolation layer 23_1A.

The first isolation layers 23_1A may be exposed between the mold patterns 51A. Each of the first isolation layers 23_1A may include the curved surface that protrudes into the first opening OP1, and a portion of the curved surface may be exposed between the mold patterns 51A.

Figure 2G:
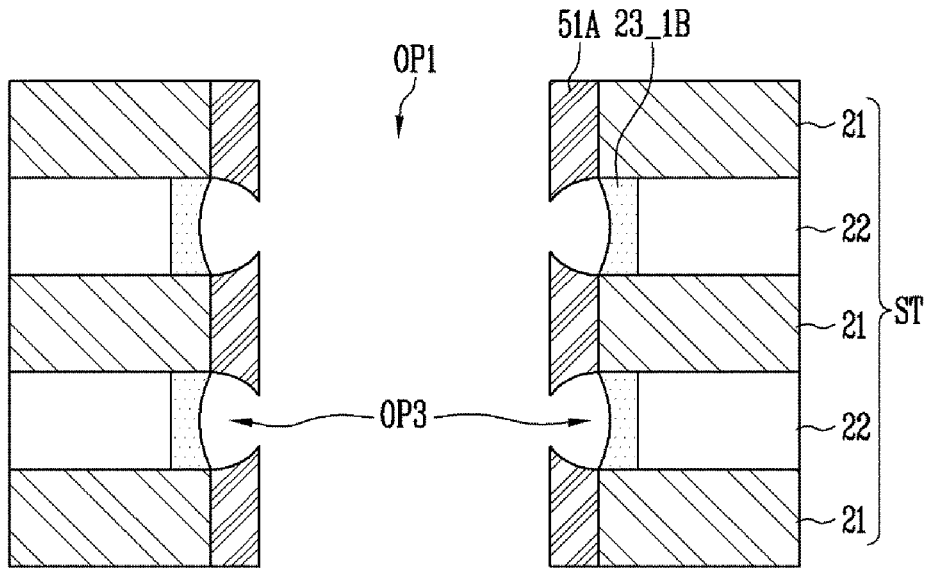

Referring to FIG. 2G, third openings OP3 may be formed between the mold patterns 51A. The first isolation layers 23_1A that are exposed between the mold patterns 51A may be etched to form the third openings OP3. The first isolation layers 23_1A may be etched by a wet etch process. Only a portion of each of the first isolation layers 23_1A may be etched, and first isolation layers 23_1B may remain between the first material layers 21. The remaining first isolation layers 23_1B may include sidewalls that are exposed through the third openings OP3. In addition, the sidewalls thereof may include curved surfaces.

Figure 2H:
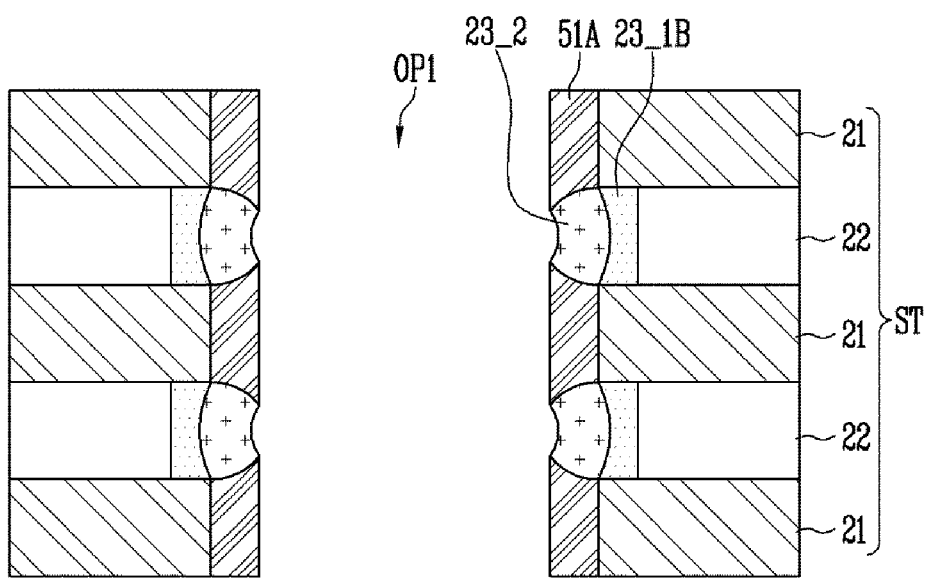

Referring to FIG. 2H, second sacrificial layers 23_2 may be formed in the third openings OP3. According to an embodiment, a second sacrificial material layer may be formed in the first opening OP1 and the third openings OP3. Subsequently, a portion of the second sacrificial material layer formed in the first opening OP1 may be etched. The second sacrificial material layer may be etched by a wet or dry etch method. As a result, the second sacrificial layers 23_2 that are located in the third openings OP3, respectively, and are separated from each other may be formed. According to an embodiment, the second sacrificial layers 23_2 may include polysilicon.

Figure 2I:
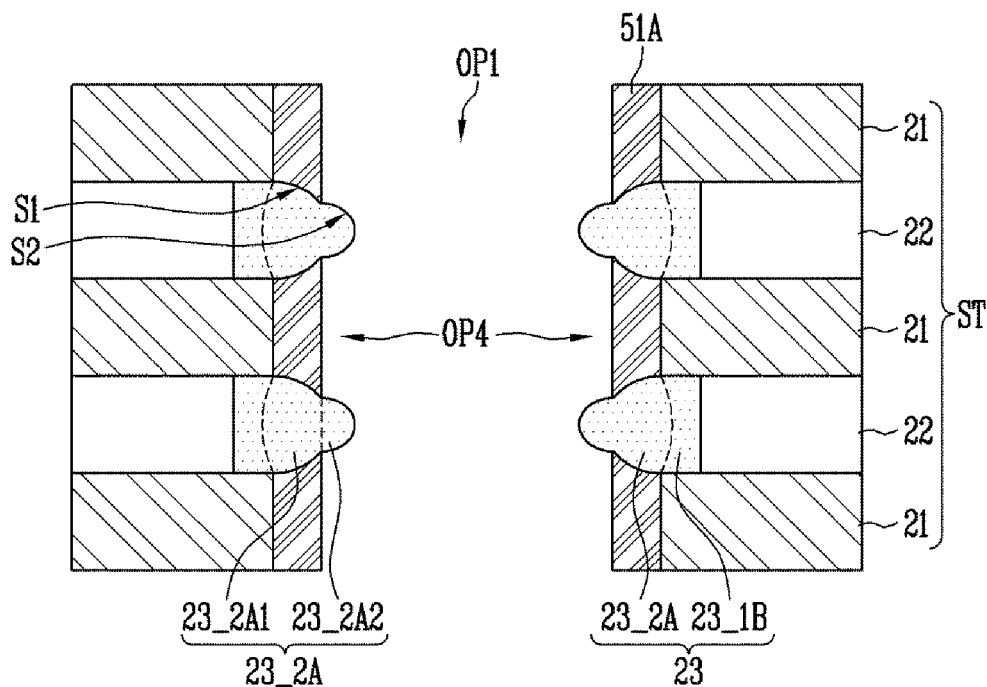

Referring to FIG. 2I, second isolation layers 23_2A that protrude farther into the first opening OP1 than the mold patterns 51A may be formed. As a result, fourth openings OP4 may be formed between the second isolation layers 23_2A. The second isolation layers 23_2A may be coupled to the first isolation layers 23_1B, respectively. The first isolation layer 23_1B and the second isolation layer 23_2A that are coupled to each other may form one isolation layer 23.

According to an embodiment, the second isolation layers 23_2A may be formed by selectively oxidizing the second sacrificial layers 23_2. The second sacrificial layers 23_2 may be oxidized by wet oxidation. The second isolation layers 23_2A may include an oxide. During the oxidation process, volume expansion may occur, so that the second isolation layers 23_2A may protrude between the mold patterns 51A. Each of the second isolation layers 23_2A may include a first portion 23_2A1 that is located between the mold patterns 51A and a second portion 23_2A2 that protrudes farther than the mold patterns 51A. The first portion 23_2A1 may include the first curved surface S1 that faces the mold patterns 51A. The second portion 23_2A2 may include the second curved surface S2. The second portion 23_2A2 may have a smaller width than the first portion 23_2A1.

Figure 2J:
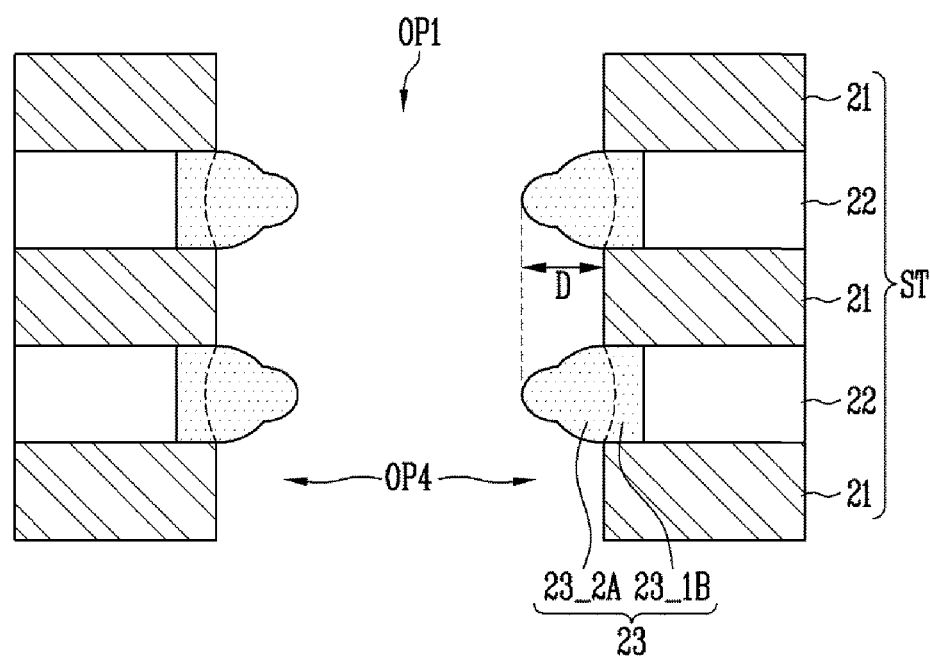

Referring to FIG. 2J, the mold patterns 51A may be removed. As a result, a depth D of each of the fourth openings OP4 may be increased. The mold patterns 51A may be etched by a wet etch process. According to an embodiment, under the condition that the mold patterns 51A have high selectively with respect to the isolation layers 23, the mold patterns 51A may be selectively etched. When the mold patterns 51A are etched, the first material layers 21 may be partially etched.

Figure 2K:
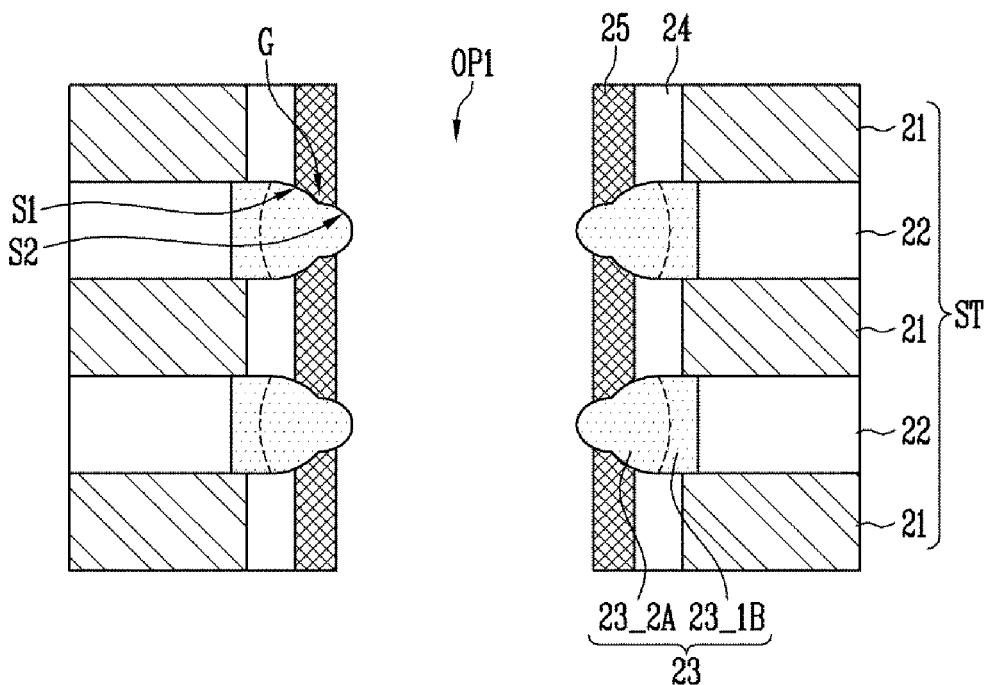

Referring to FIG. 2K, blocking patterns 24 may be formed. The blocking patterns 24 may be located in the fourth openings OP4, respectively, and may be separated from each other. Each of the blocking patterns 24 may be located between the first isolation layers 23_1B or between the second isolation layers 23_2A. Alternatively, however, each of the blocking patterns 24 may be located between the first isolation layers 23_1B or between the second isolation layers 23_2A. According to an embodiment, the sidewalls of the first material layers 21 that are exposed through the fourth openings OP4 may be oxidized to form the blocking patterns 24.

Memory patterns 25 may then be formed. The memory patterns 25 may be located in the fourth openings OP4, respectively, and may be separated from each other. Each of the memory patterns 25 may be located between the second isolation layers 23_2A. According to an embodiment, a memory layer may be formed in the first opening OP1 and the fourth openings OP4. Subsequently, a portion of the memory layer that is formed in the first opening OP1 may be etched. The memory layer may be etched by a wet etch method or a dry etch method. As a result, the memory patterns 25 that are located in the fourth openings OP4, respectively, and are separated from each other may be formed. Each of the memory patterns 25 may face the first curved surface S1 and the second curved surface S2. Each of the memory patterns 25 may fill the groove G between the first curved surface S1 and the second curved surface S2. The isolation layers 23 may protrude between the memory patterns 25.

Figure 2L:
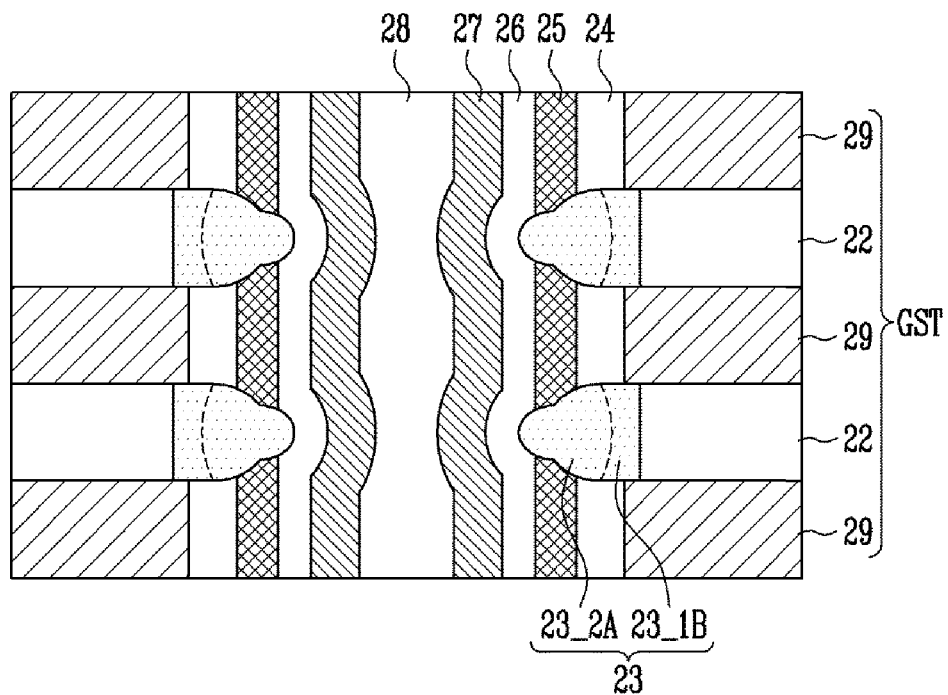

Referring to FIG. 2L, a tunnel insulating layer 26 may be formed in the first opening OP1. The tunnel insulating layer 26 may be formed on the memory patterns 25 and the isolation layers 23. The tunnel insulating layer 26 may include a curved surface that surrounds the isolation layers 23 that protrude between the memory patterns 25.

Subsequently, a channel layer 27 may be formed in the tunnel insulating layer 26. The channel layer 27 may be formed on an inner surface of the tunnel insulating layer 26. The profile of the tunnel insulating layer 26 may be transferred onto the channel layer 27. The channel layer 27 may include a curved surface that surrounds the isolation layers 23 protruding between the memory patterns 25. Subsequently, a core 28 may be formed in the channel layer 27.

The first material layers 21 may then be replaced by third material layers 29. For example, when the first material layers 21 are sacrificial layers and the second material layers 22 are insulating layers, a slit (not shown) may be formed through the stacked structure ST, and the first material layers 21 may be removed through the slit. The third material layers 29 may be formed on areas from which the first material layers 21 are removed. In another example, when the first material layers 21 are conductive layers and the second material layers 22 are insulating layers, a slit (not shown) may be formed through the stacked structure ST, and the first material layers 21 that are exposed through the slit may be silicided. As a result, the gate structure GST that includes the third material layers 29 and the second material layers 22 alternately stacked with each other may be formed.

According to the above-described manufacturing method, after the first isolation layer 23_1A is formed, the second isolation layer 23_2A may be formed by using the mold patterns 51A. As a result, an isolation layer 23 that includes the first isolation layer 23_1B and the second isolation layer 23_2A may be formed. Since the isolation layer 23 is formed through two processes, the depth of the fourth opening OP4 may be more increased as compared to when the isolation layer is formed through a single step. Therefore, the memory patterns 25 may be effectively separated. The method of forming the mold patterns 51A and the second isolation layer 23_2A may be repeatedly performed. As a result, the depth of the fourth opening OP4 may be further increased.

FIGS. 3A to 3I are diagrams illustrating a method of manufacturing a semiconductor device according to an embodiment of the present disclosure. Hereinafter, any repetitive detailed description of components already mentioned above will be omitted.

Figure 3A:
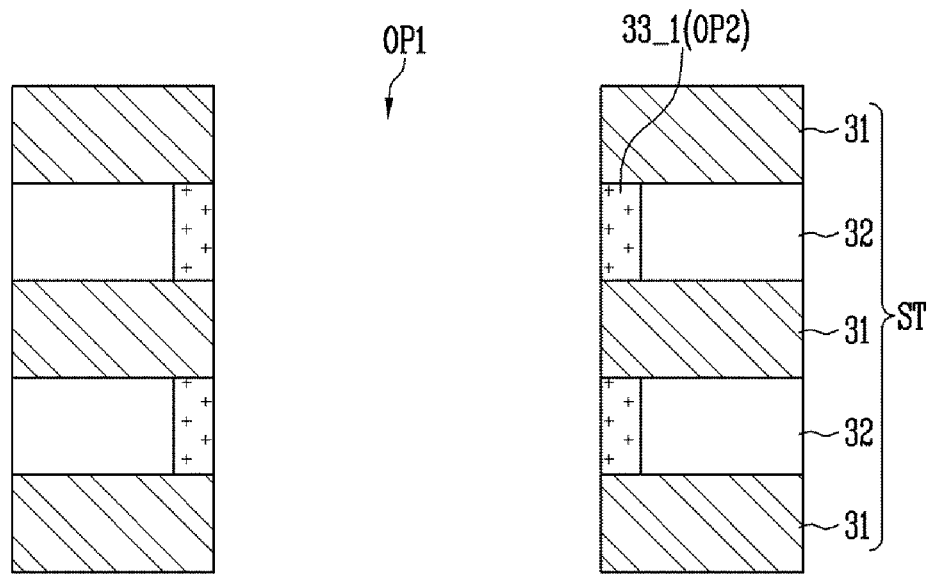
FIGS. 3A to 3I are diagrams illustrating a method of manufacturing a semiconductor device according to an embodiment of the present disclosure.

Referring to FIG. 3A, the stacked structure ST may be formed. The stacked structure ST may include first material layers 31 and second material layers 32 that are alternately stacked with each other. Subsequently, the first opening OP1 may be formed through the stacked structure ST. The second openings OP2 may be formed between the first material layers 31, and first sacrificial layers 33_1 may be formed in the second openings OP2.

Figure 3B:
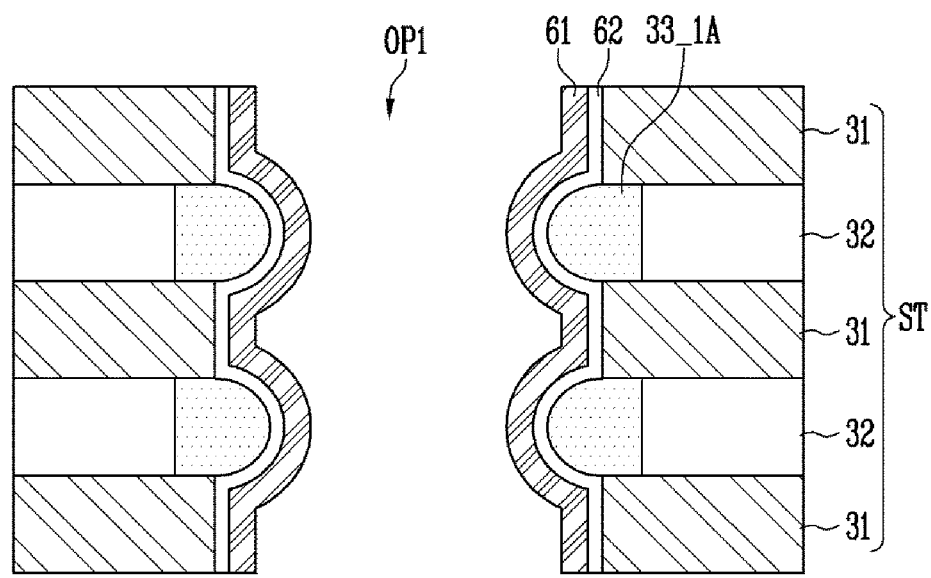

Referring to FIG. 3B, first isolation layers 33_1A that protrude into the first opening OP1 may be formed. According to an embodiment, the first isolation layers 33_1A may be formed by oxidizing the first sacrificial layers 33_1. A protective layer 62 may be formed in the first opening OP1. The protective layer 62 may be provided to protect the first material layers 31 during subsequent processes. The protective layer 62 may be formed on the sidewalls of the first material layers 31 and the surfaces of the first isolation layers 33_1A. A mold layer 61 may be formed on the protective layer 62. The protective layer 62 may include a material with high etch selectivity with respect to the first material layers 31 and the mold layer 61. The first material layers 31 and the mold layer 61 may include nitrides, and the protective layer 62 may include polysilicon.

Figure 3C:
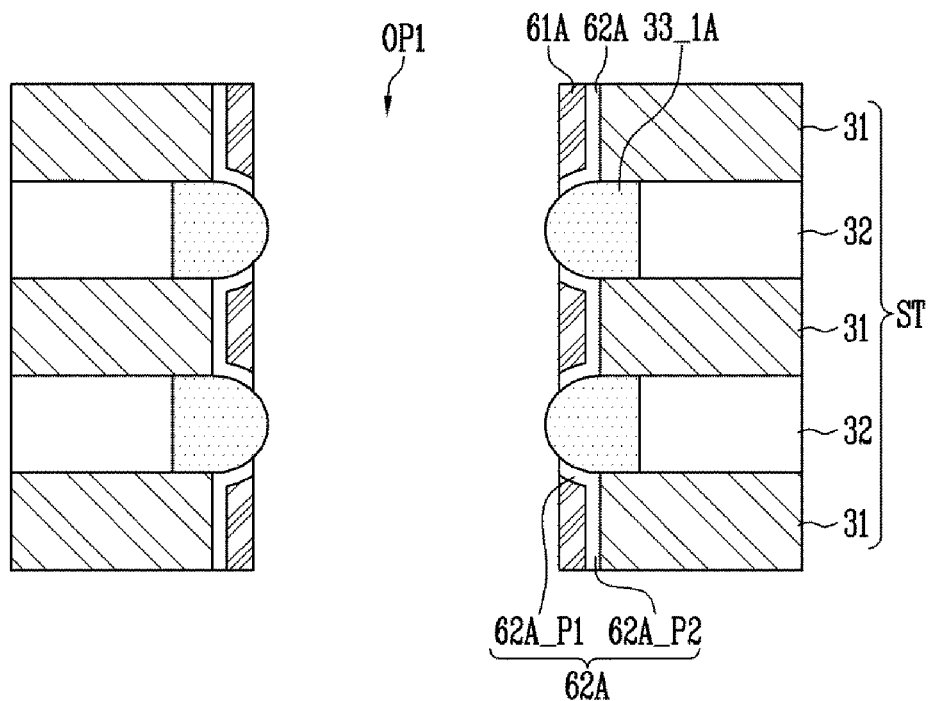

Referring to FIG. 3C, mold patterns 61A and protective patterns 62A may be formed between the first isolation layers 33_1A. According to an embodiment, the mold patterns 61A that expose the first isolation layers 33_1A, respectively, may be formed by etching the mold layer 61. Protective patterns 62A that expose the first isolation layers 33_1A, respectively, may be formed by etching the protective layer 62. The protective patterns 62A may surround the mold patterns 61A, respectively. Each of the protective patterns 62A may include a first portion 62A_P1 that is located between the mold pattern 61A and the first isolation layer 33_1A and a second portion 62A_P2 that is located between the mold pattern 61A and the first material layer 31.

Figure 3D:
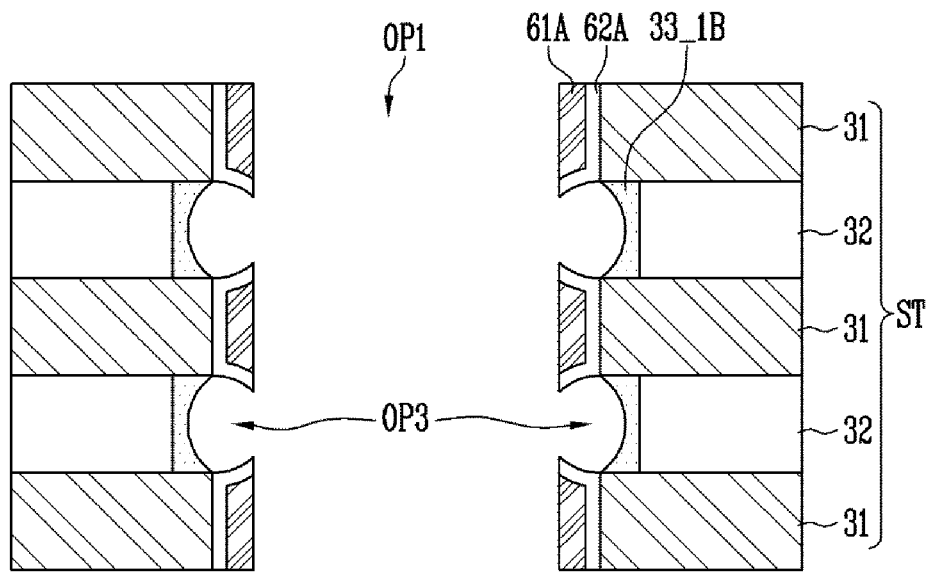

Referring to FIG. 3D, the third openings OP3 may be formed between the mold patterns 61A. The third openings OP3 may extend between the protective patterns 62A. By partially etching the first isolation layers 33_1A that are exposed between the mold patterns 61A and between the protective patterns 62A, the third openings OP3 may be formed. The remaining first isolation layers 33_1B may include sidewalls that are exposed through the third openings OP3, and the sidewalls thereof may include curved surfaces.

Figure 3E:
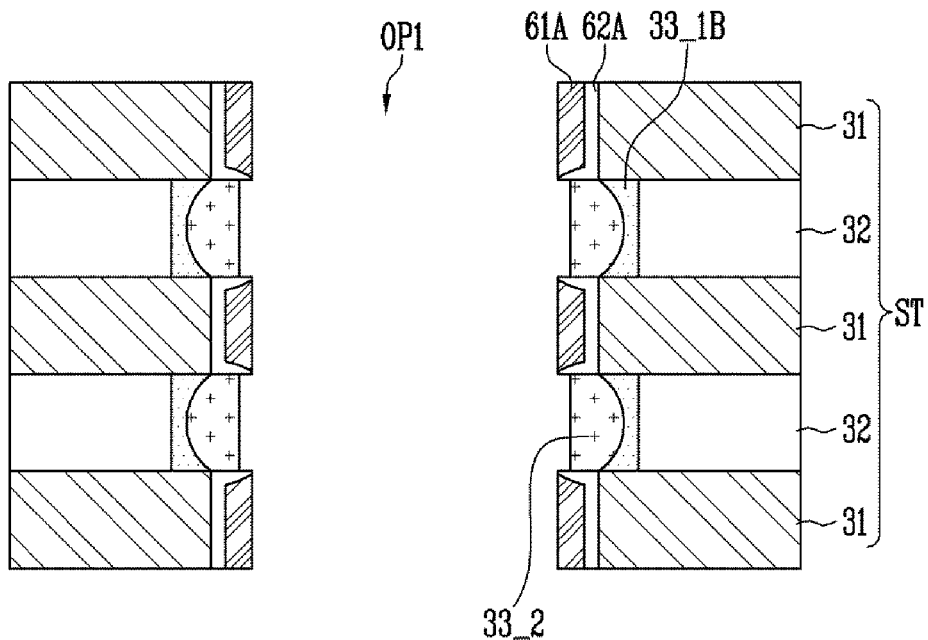

Referring to FIG. 3E, second sacrificial layers 33_2 may be formed in the third openings OP3. According to an embodiment, after a second sacrificial material layer is formed in the first opening OP1 and the third openings OP3, the second sacrificial material layer may be partially etched to form the second sacrificial layers 33_2. Each of the protective patterns 62A may be partially etched when the second sacrificial material layer is etched. The first portion 62A_P1 of each of the protective patterns 62A may be etched.

Figure 3F:
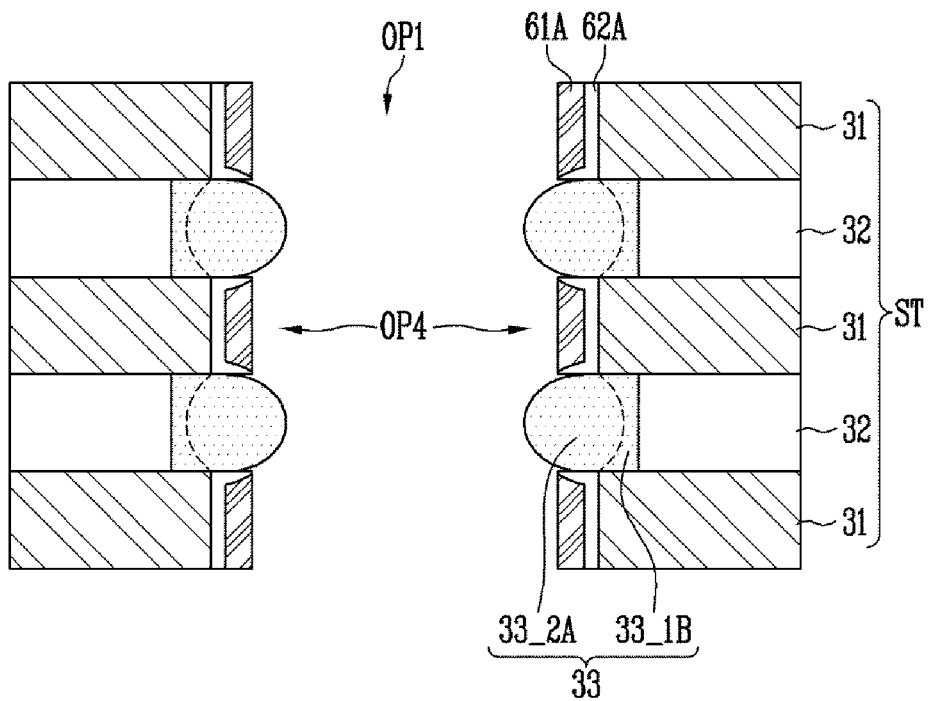

Referring to FIG. 3F, second isolation layers 33_2A that protrude farther into the first opening OP1 than the mold patterns 61A may be formed. According to an embodiment, the second isolation layers 33_2A may be formed by selectively oxidizing the second sacrificial layers 33_2. During the oxidation process, volume expansion may occur so that the second isolation layers 33_2A may protrude between the protective patterns 62A and the mold patterns 61A. As a result, the fourth openings OP4 may be formed between the second isolation layers 33_2A. The second isolation layers 33_2A may be coupled to the first isolation layers 33_1B, respectively. The first isolation layer 33_1B and the second isolation layer 33_2A that are coupled to each other may form one isolation layer 33.

Figure 3G:
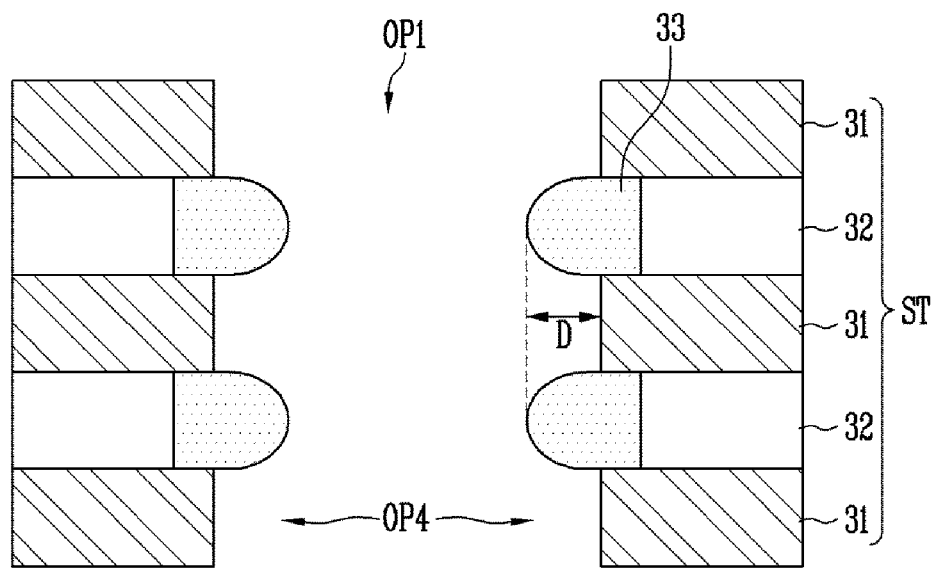

Referring to FIG. 3G, the mold patterns 61A may be removed. Under the condition that the mold patterns 61A have high etch selectivity with respect to the isolation layers 33, the mold patterns 61A may be selectively etched. As a result, protective patterns 62A may be exposed. When the mold patterns 61A are etched, the first material layers 31 may be protected by the protective patterns 62A. Subsequently, the protective patterns 62A may be removed. Under the condition that the protective patterns 62A have high etch selectivity with respect to the first material layers 31 and the isolation layers 33, the protective patterns 62A may be selectively etched. As a result, sidewalls of the first material layers 31 may be exposed, and a depth D of the fourth openings OP4 may be increased.

Figure 3H:
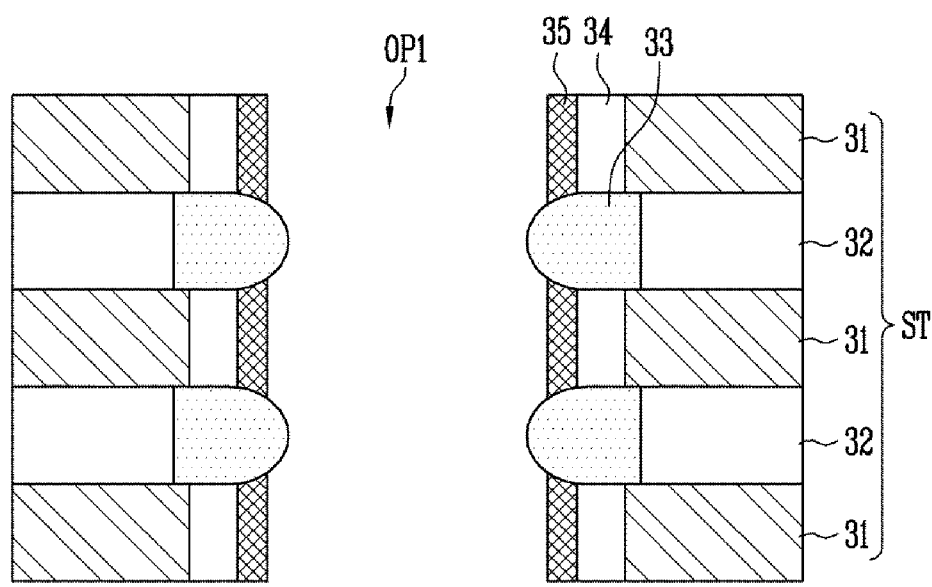

Referring to FIG. 3H, blocking patterns 34 may be formed. The blocking patterns 34 may be located in the fourth openings OP4, respectively, and may be separated from each other. The blocking patterns 34 may be located between the isolation layers 33. According to an embodiment, sidewalls of the first material layers 31 that are exposed through the fourth openings OP4 may be oxidized to form the blocking patterns 34.

Memory patterns 35 may then be formed. The memory patterns 35 may be located in the fourth openings OP4, respectively, and may be separated from each other. The isolation layers 33 may protrude between the memory patterns 35.

Figure 3I:
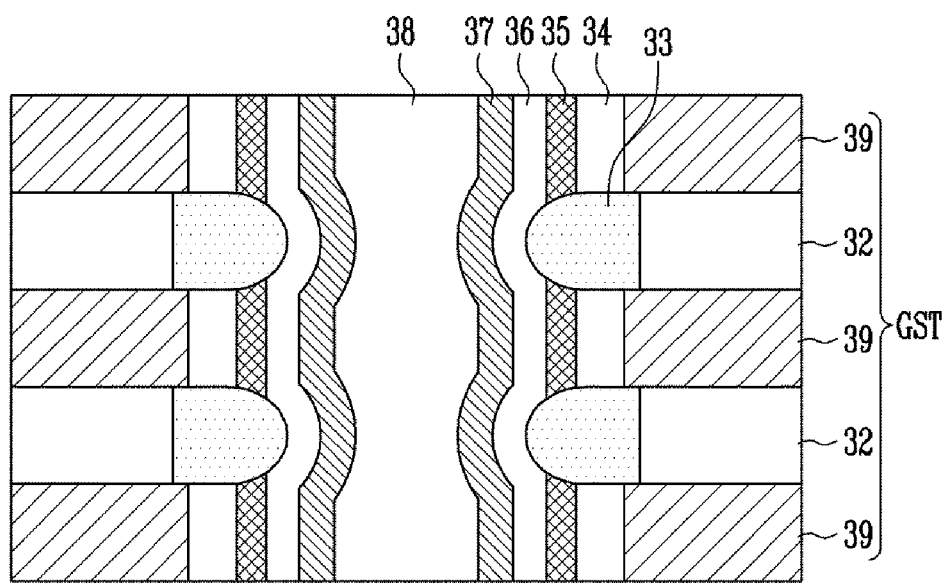

Referring to FIG. 3I, a tunnel insulating layer 36 may be formed in the first opening OP1. The tunnel insulating layer 36 may be formed on the memory patterns 35 and the isolation layers 33. The tunnel insulating layer 36 may include a curved surface that surrounds the isolation layers 33 that protrude between the memory patterns 35. Subsequently, a channel layer 37 may be formed in the tunnel insulating layer 36. The channel layer 37 may include a curved surface that surrounds the isolation layers 33 that protrude between the memory patterns 35. Subsequently, a core 38 may be formed in the channel layer 37. Subsequently, the first material layers 31 may be replaced by third material layers 39. As a result, the gate structure GST that includes the third material layers 39 and the second material layers 32 alternately stacked with each other may be formed.

According to the above-described manufacturing method, by forming the isolation layer 33 through two processes, the depth of the fourth opening OP4 may be increased. Therefore, the memory patterns 35 may be effectively separated. In addition, since the sidewalls of the first material layers 31 are protected by the protective patterns 62A, damage to the first material layers 31 may be prevented during the manufacturing processes.

FIGS. 4A to 4F are diagrams illustrating a method of manufacturing a semiconductor device according to an embodiment of the present disclosure. Hereinafter, any repetitive detailed description of components already mentioned above will be omitted.

Figure 4A:
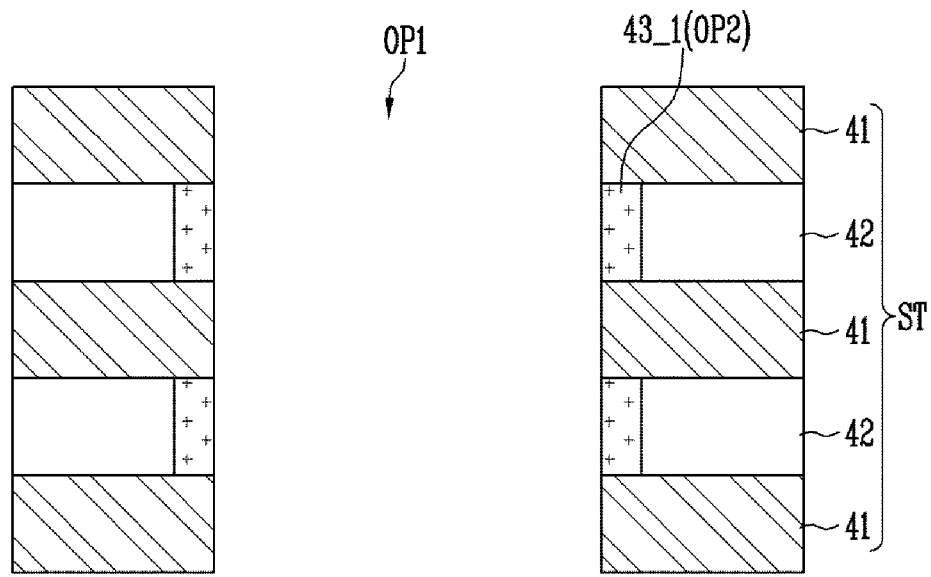
FIGS. 4A to 4F are diagrams illustrating a method of manufacturing a semiconductor device according to an embodiment of the present disclosure.

Referring to FIG. 4A, the stacked structure ST that includes first material layers 41 and second material layers 42 alternately stacked with each other may be formed. Subsequently, the first opening OP1 may be formed through the stacked structure ST. The second openings OP2 may be formed between the first material layers 41, and first sacrificial layers 43_1 may be formed in the second openings OP2.

Figure 4B:
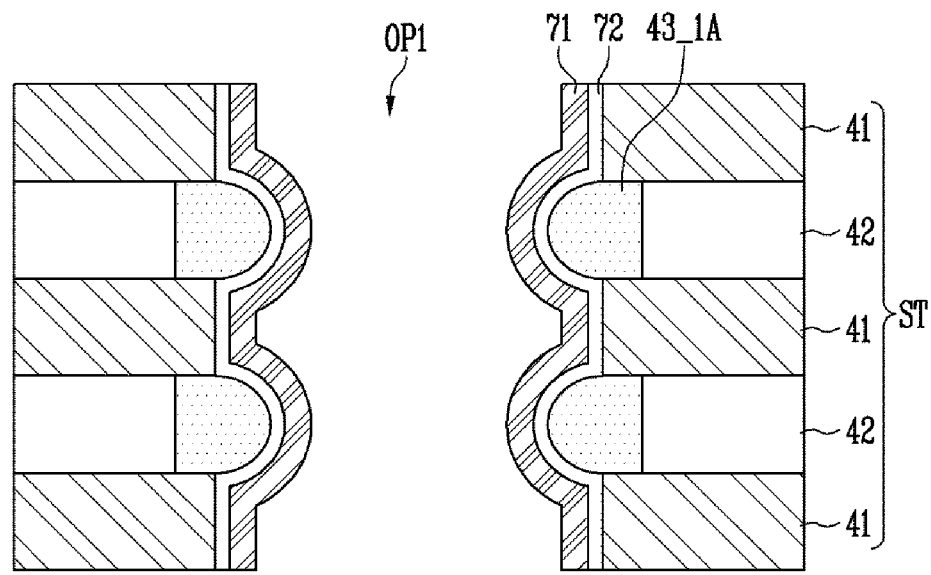

Referring to FIG. 4B, first isolation layers 43_1A may be formed by oxidizing the first sacrificial layers 43_1. A protective layer 72 may be formed in the first opening OP1. The protective layer 72 may be provided to protect the first material layers 41 during subsequent processes. A mold layer 71 may be formed on the protective layer 72.

Figure 4C:
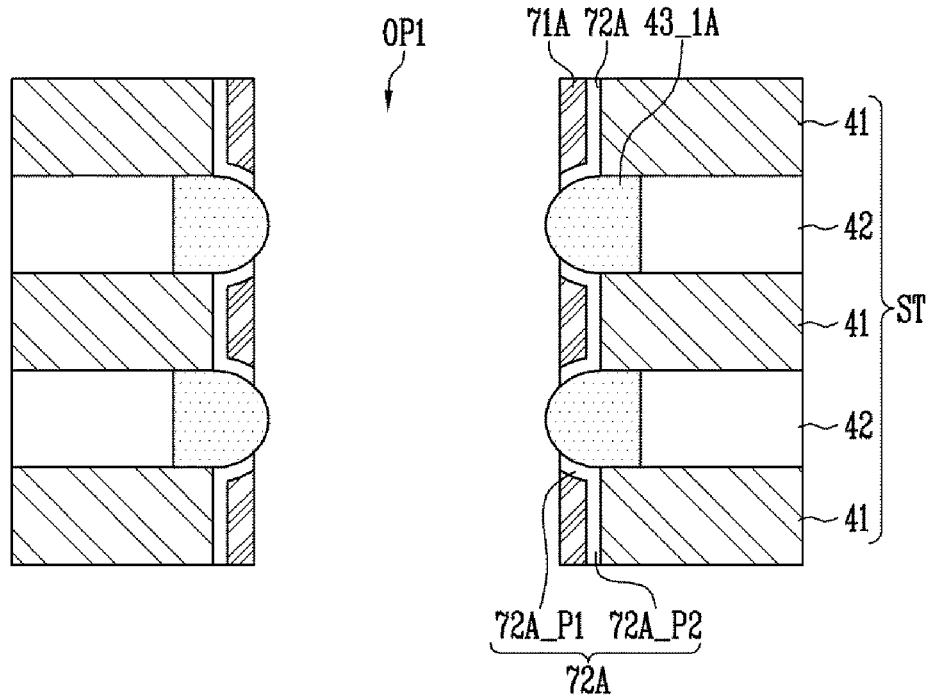

Referring to FIG. 4C, mold patterns 71A that expose the first isolation layers 43_1A, respectively, may be formed by etching the mold layer 71. Protective patterns 72A that expose the first isolation layers 43_1A, respectively, may be formed by etching the protective layer 72. Each of the protective patterns 72A may include a first portion 72A_P1 that is located between the mold pattern 71A and the first isolation layer 43_1A and a second portion 72A_P2 that is located between the mold pattern 71A and the first material layer 41.

Figure 4D:
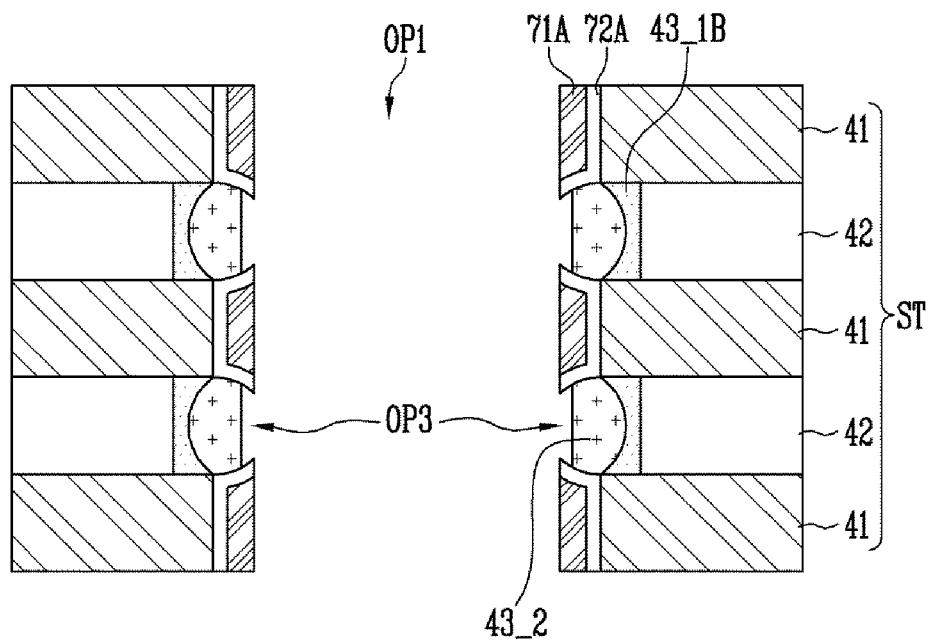

Referring to FIG. 4D, by partially etching the first isolation layers 43_1A that are exposed between the mold patterns 71A and between the protective patterns 72A, the third openings OP3 may be formed. Second sacrificial layers 43_2 may be formed in the third openings OP3.

Figure 4E:
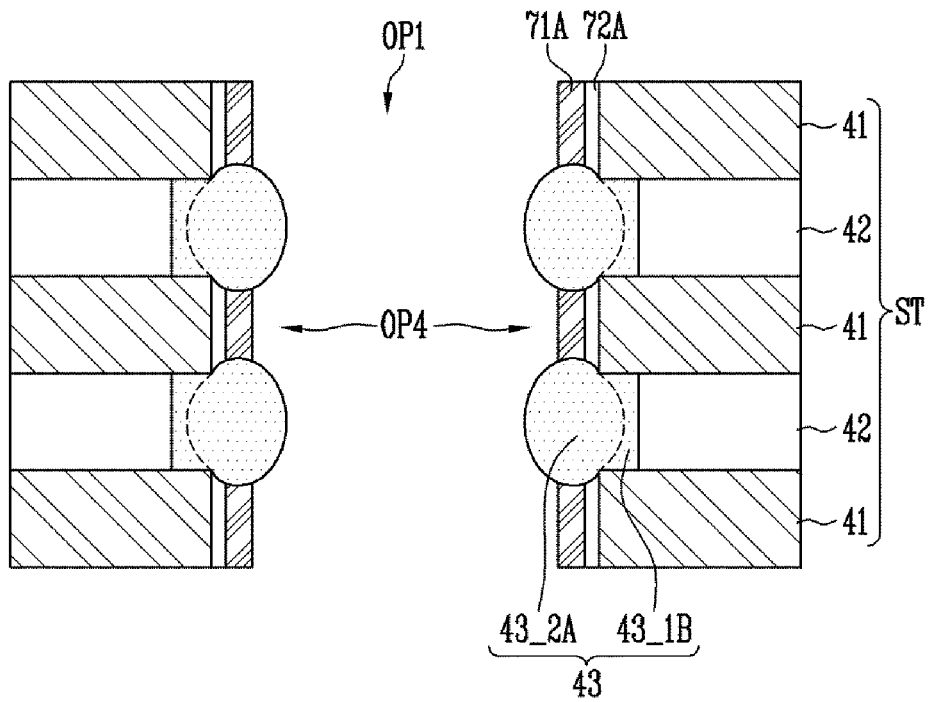

Referring to FIG. 4E, second isolation layers 43_2A may be formed by oxidizing the second sacrificial layers 43_2. A first isolation layer 43_1B and the second isolation layer 43_2A that are coupled to each other may form one isolation layer 43. During the oxidation process, volume expansion may occur so that the second isolation layers 43_2A may protrude between the protective patterns 72A and the mold patterns 71A. As a result, the fourth openings OP4 may be formed between the second isolation layers 43_2A.

When the second sacrificial layers 43_2 are oxidized, portions of the protective patterns 72A that are adjacent to the second sacrificial layers 43_2 may be oxidized. According to an embodiment, the first portion 72A_P1 of each of the protective patterns 72A may be oxidized. When the second sacrificial layers 43_2 are oxidized, portions of the mold patterns 71A that are adjacent to the second sacrificial layers 43_2 may be oxidized.

Figure 4F:
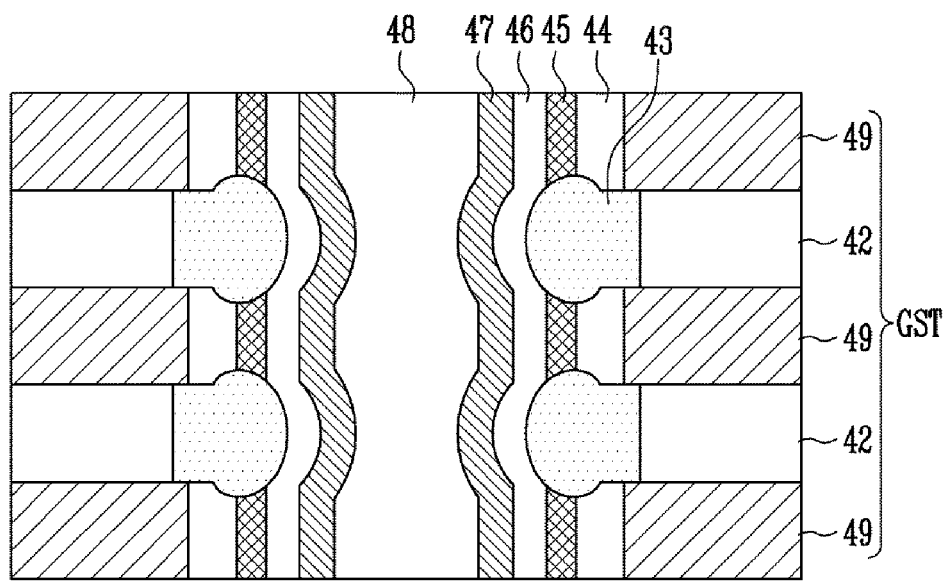

Referring to FIG. 4F, the mold patterns 71A and the protective patterns 72A may be removed. As a result, sidewalls of the first material layers 41 may be exposed, and the depth of the fourth openings OP4 may be increased. Blocking patterns 44 may be formed by oxidizing the sidewalls of the first material layers 41. Subsequently, memory patterns 45 that are located in the fourth openings OP4, respectively, may be formed. Subsequently, a tunnel insulating layer 46, a channel layer 47, and a core 48 may be formed. Subsequently, the first material layers 41 may be replaced by third material layers 49. As a result, the gate structure GST that includes the third material layers 49 and the second material layers 42 alternately stacked with each other may be formed.

According to the above-described manufacturing method, by forming the isolation layer 43 through two processes, the depth of the fourth opening OP4 may be increased. Therefore, the memory patterns 45 may be effectively separated. In addition, since the sidewalls of the first material layers 41 are protected by the protective patterns 72A, damage to the first material layers 41 may be prevented during the manufacturing processes.

Figure 5:
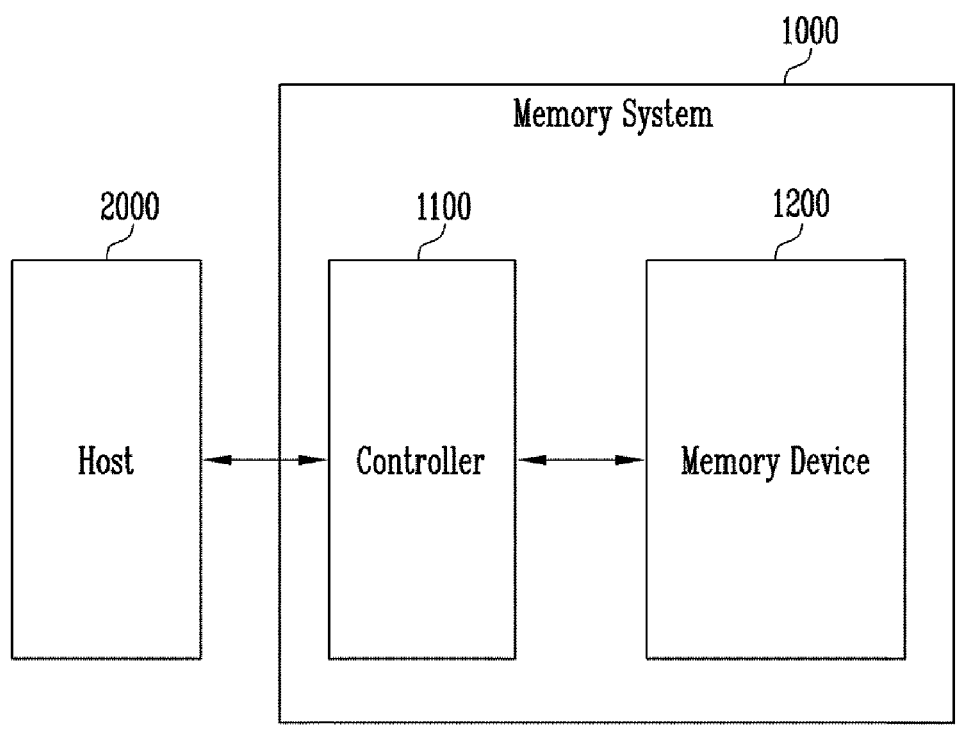
FIG. 5 is a diagram illustrating a memory system according to an embodiment of the present disclosure.

FIG. 5 is a diagram illustrating a memory system 1000 according to an embodiment of the present disclosure.

Referring to FIG. 5, the memory system 1000 may include a memory device 1200 configured to store data and a controller 1100 configured to perform communications between the memory device 1200 and a host 2000.

The host 2000 may be a device or system configured to store data in the memory system 1000 or retrieve data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 by using at least one interface protocol among, for example, Peripheral Component Interconnect Express (PCIe), Advanced Technology Attachment (ATA), Serial ATA (SATA), Parallel ATA (PATA), Serial Attached SCSI (SAS), Non-Volatile Memory express (NVMe), Universal Serial Bus (USB), Multi-Media Card (MMC), Enhanced Small Disk Interface (ESDI), and Integrated Drive Electronics (IDE).

The host 2000 may include at least one of a computer, a portable digital device, a tablet, a digital camera, a digital audio player, a television, a wireless communication device, or a cellular phone. However, embodiments of the disclosed technology are not limited thereto.

The controller 1100 may control overall operations of the memory system 1000. The controller 1100 may control the memory device 1200 in response to the requests of the host 2000. The controller 1100 may control the memory device 1200 to perform a program operation, a read operation and an erase operation at the request of the host 2000. Alternatively, the controller 1100 may perform a background operation for performance improvement of the memory system 1000 in the absence of the request from the host 2000.

To control the operations of the memory device 1200, the controller 1100 may transfer a control signal and a data signal to the memory device 1200. The control signal and the data signal may be transferred to the memory device 1200 through different input/output lines. The data signal may include a command, an address, or data. The control signal may be used to differentiate periods in which the data signal is input.

The memory device 1200 may perform a program operation, a read operation and an erase operation in response to control of the controller 1100. The memory device 1200 may be a volatile memory that loses data when a power supply is blocked, or a non-volatile memory that retains data in the absence of power supply. The memory device 1200 may have the structure as described above with reference to FIGS. 1A to 1C. In addition, the memory device 1200 may be a semiconductor device manufactured by the method as described above with reference to FIGS. 2A to 2L, FIGS. 3A to 3I, and FIGS. 4A to 4F. According to an embodiment, a semiconductor device may include a gate structure that includes conductive layers and insulating layers alternately stacked with each other; a channel layer that passes through the gate structure; blocking patterns located between the channel layer and the conductive layers; memory patterns located between the channel layer and the blocking patterns; and isolation layers located between the channel layer and the insulating layers, each of the isolation layers including a first portion with a first curved surface and a second portion with a second curved surface, in which the second portion has a smaller width than the first portion, and at least a portion of the second portion protrudes farther toward the channel layer than the memory patterns.

Figure 6:
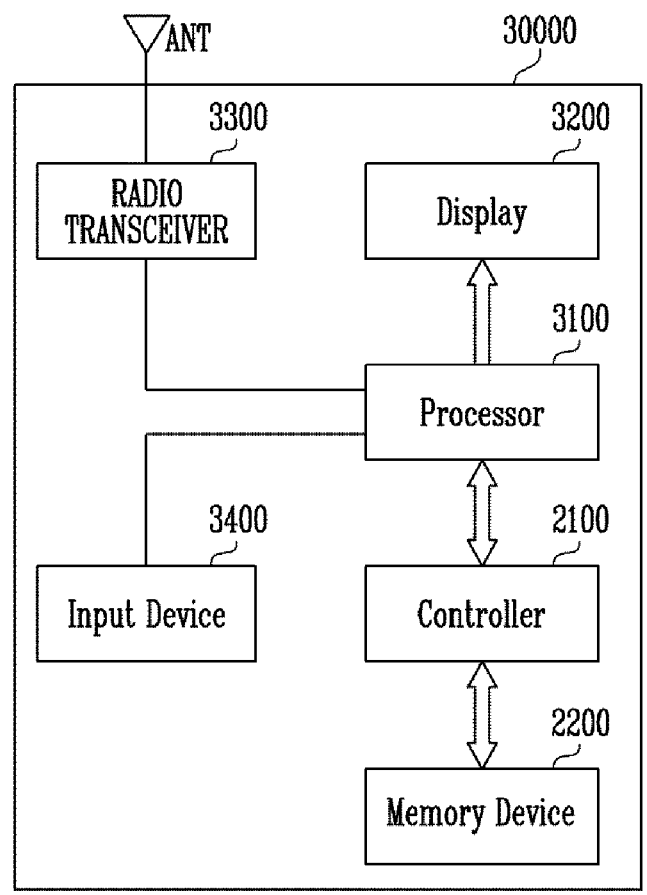
FIG. 6 is a diagram illustrating a memory system according to an embodiment of the present disclosure.

FIG. 6 is a diagram illustrating a memory system 30000 according to an embodiment of the present disclosure.

Referring to FIG. 6, the memory system 30000 may be incorporated into a cellular phone, a smart phone, a tablet, a personal computer (PC), a personal digital assistant (PDA), or a wireless communication device. The memory system 30000 may include a memory device 2200 and a controller 2100 controlling the operations of the memory device 2200.

The controller 2100 may control a data access operation of the memory device 2200, for example, a program operation, an erase operation or a read operation of the memory device 2200 in response to control of a processor 3100.

The data programmed into the memory device 2200 may be output through a display 3200 in response to control of the controller 2100.

A radio transceiver 3300 may exchange a radio signal through an antenna ANT. For example, the radio transceiver 3300 may change the radio signal received through the antenna ANT into a signal that may be processed by the processor 3100. Therefore, the processor 3100 may process the signal output from the radio transceiver 3300 and transfer the processed signal to the controller 2100 or the display 3200. The controller 2100 may transfer the signal processed by the processor 3100 into the memory device 2200. In addition, the radio transceiver 3300 may change a signal output from the processor 3100 into a radio signal and output the radio signal to an external device through the antenna ANT. A control signal for controlling the operations of the host or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the controller 2100, data output from the radio transceiver 3300, or data output from an input device 3400 may be output through the display 3200.

According to an embodiment, the controller 2100 capable of controlling the operations of the memory device 2200 may be realized as a portion of the processor 3100, or as a separate chip from the processor 3100.

Figure 7:
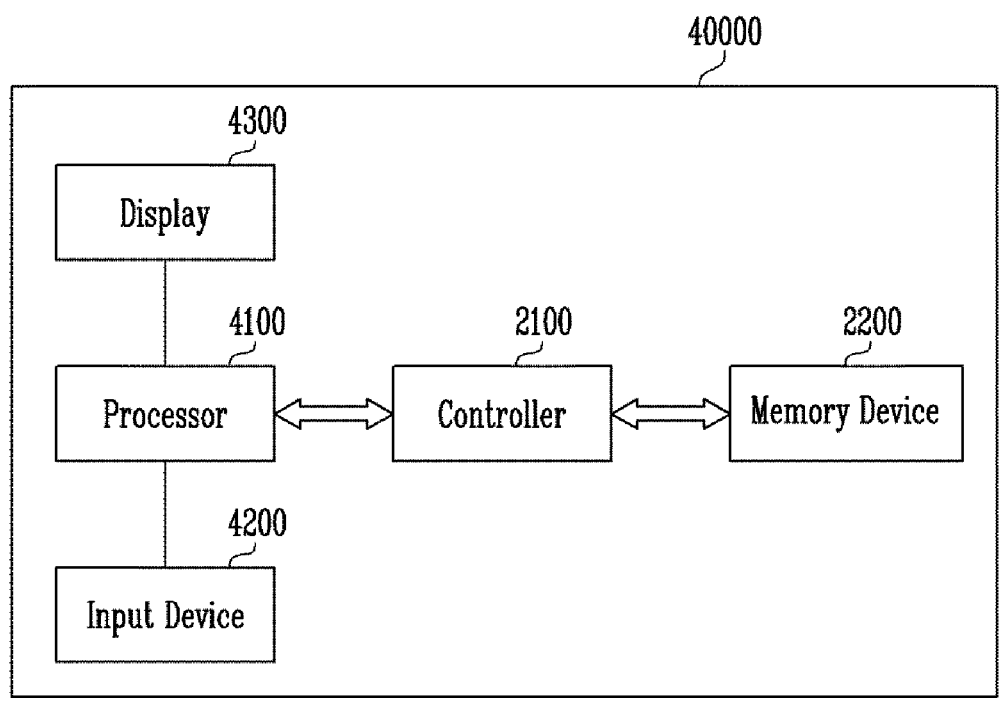
FIG. 7 is a diagram illustrating a memory system according to an embodiment of the present disclosure.

FIG. 7 is a diagram illustrating a memory system 40000 according to an embodiment of the present disclosure.

Referring to FIG. 7, the memory system 40000 may be incorporated into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the controller 2100 that controls a data processing operation of the memory device 2200.

A processor 4100 may output data stored in the memory device 2200 through a display 4300 according to data input through an input device 4200. Examples of the input device 4200 may include a pointing device such as a touch pad or a computer mouse, a keypad, or a keyboard.

The processor 4100 may control overall operations of the memory system 40000 and control operations of the controller 2100. According to an embodiment, the controller 2100 capable of controlling the operations of the memory device 2200 may be realized as a portion of the processor 4100, or as a separate chip from the processor 4100.

Figure 8:
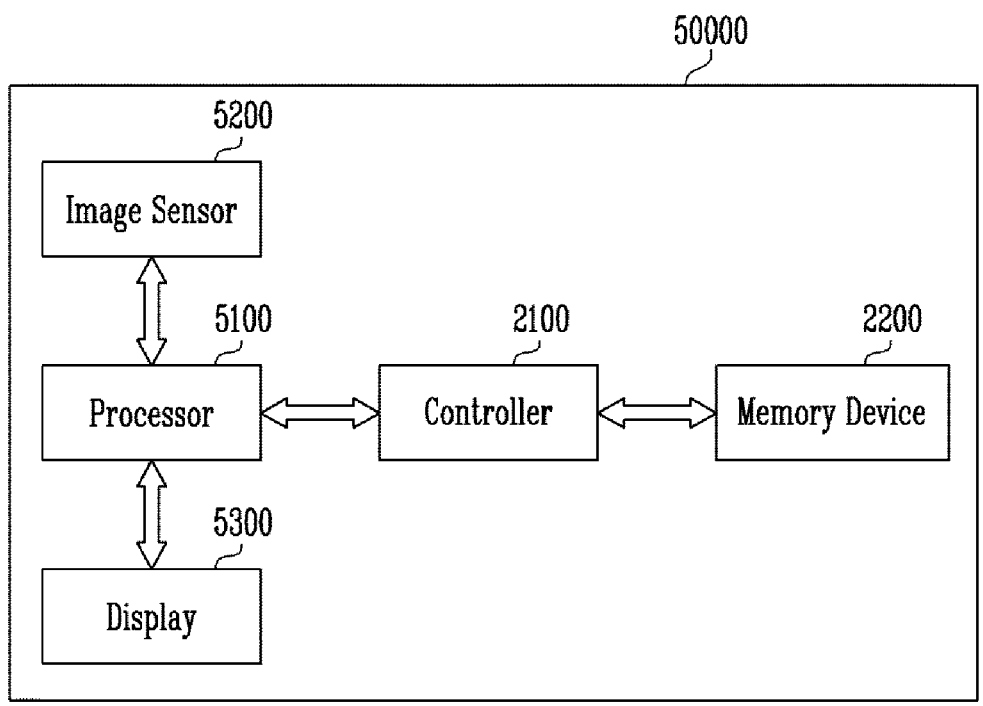
FIG. 8 is a diagram illustrating a memory system according to an embodiment of the present disclosure.

FIG. 8 is a block diagram illustrating a memory system 50000 according to an embodiment of the present disclosure.

Referring to FIG. 8, the memory system 50000 may be incorporated into an image processor, for example, a digital camera, a cellular phone with a digital camera attached thereto, a smart phone with a digital camera attached thereto, or a table PC with a digital camera attached thereto.

The memory system 50000 may include the memory device 2200 and the controller 2100 that controls a data processing operation of the memory device 2200, for example, a program operation, an erase operation, or a read operation.

An image sensor 5200 of the memory system 50000 may convert an optical image into digital signals. The converted digital signals may be transferred to a processor 5100 or the controller 2100. In response to control of the processor 5100, the converted digital signals may be output through a display 5300 or stored in the memory device 2200 through the controller 2100. In addition, the data stored in the memory device 2200 may be output through the display 5300 in response to control of the processor 5100 or the controller 2100.

According to an embodiment, the controller 2100 capable of controlling the operations of the memory device 2200 may be formed as a part of the processor 5100, or a separate chip from the processor 5100.

Figure 9:
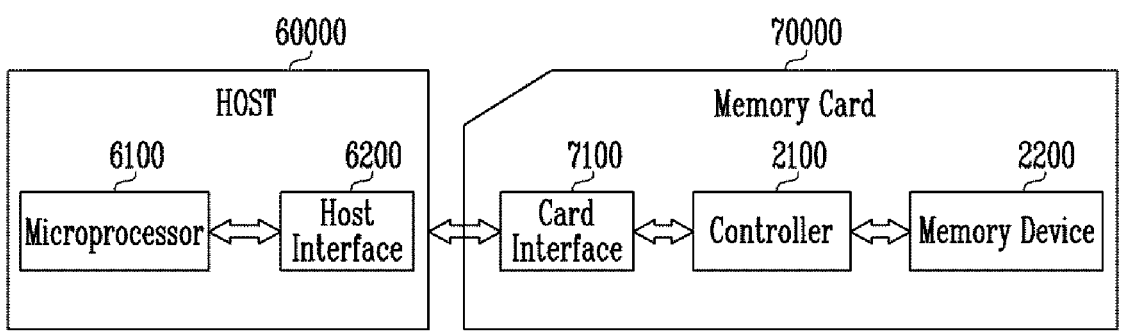
FIG. 9 is a diagram illustrating a memory system according to an embodiment of the present disclosure.

FIG. 9 is a diagram illustrating a memory system 70000 according to an embodiment of the present disclosure.

Referring to FIG. 9, the memory system 70000 may include a memory card or a smart card. The memory system 70000 may include the memory device 2200, the controller 2100, and a card interface 7100.

The controller 2100 may control data exchange between the memory device 2200 and the card interface 7100. According to an embodiment, the card interface 7100 may be, but is not limited thereto, a secure digital (SD) card interface or a multi-media card (MMC) interface.

The card interface 7100 may interface data exchange between a host 60000 and the controller 2100 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a cellular phone, a console video game hardware, or a digital set-top box, the host interface 6200 may perform data communication with the memory device 2200 through the card interface 7100 and the controller 2100 in response to control of a microprocessor 6100.

According to the present disclosure, by three-dimensionally stacking memory cells, the density of integration of a semiconductor device may be improved. In addition, a semiconductor device with a stabilized structure and improved reliability may be provided.

What is claimed is:

1. A method of manufacturing a semiconductor device, the method comprising:
    forming a stacked structure with first material layers and second material layers that are alternately stacked with each other;
    forming a first opening that passes through the stacked structure;
    forming second openings between the first material layers;
    forming first sacrificial layers in the second openings;
    forming first isolation layers that protrude into the first opening by oxidizing the first sacrificial layers;
    forming mold patterns on the first material layers between the protruding portions of the first isolation layers;
    forming third openings by etching portions of the first isolation layers that are exposed between the mold patterns, wherein remaining portions of the first isolation layers respectively form sidewalls of the third openings;
    forming second sacrificial layers in the third openings; and
    forming second isolation layers that protrude farther toward the center of the first opening than the mold patterns by oxidizing the second sacrificial layers, wherein the second isolation layers are respectively connected to the remaining portions of the first isolation layers.

2. The method of claim 1, wherein the forming of the second isolation layers comprises forming fourth openings between the second isolation layers.

3. The method of claim 2, further comprising removing the mold patterns to increase a depth of the fourth openings.

4. The method of claim 1, wherein the forming of the mold patterns comprises:
forming a mold layer in the first opening on the second material layer and the first isolation layers; and
forming the mold patterns by etching the mold layer,
wherein the mold patterns protrude toward a center of the first opening.

5. The method of claim 4, wherein each of the first isolation layers includes a curved surface that protrudes into the first opening, and
wherein a portion of the curved surface is exposed between the mold patterns when the mold patterns are etched.

6. The method of claim 1, wherein in the forming of the mold patterns, portions of the mold patterns that are farther from the first material layers have a greater width than portions thereof that are adjacent to the first material layers.

7. The method of claim 1, wherein the second isolation layers include first portions that are located between the mold patterns and second portions that protrude farther than the mold patterns, and
wherein the second portions have a smaller width than the first portions.

8. The method of claim 1, further comprising:
forming a protective layer in the first opening before the mold patterns are formed;
forming protective patterns exposing the first isolation layers, respectively, by etching the protective layer; and
removing the mold patterns to expose the protective layer after the second isolation layers are formed.

9. The method of claim 8, wherein the protective layer includes a material with high etch selectivity with respect to the first material layers and the mold patterns.

10. The method of claim 1, further comprising:
removing the mold patterns; and
forming memory patterns between the second isolation layers.

11. The method of claim 10, wherein in the forming of the memory patterns, the memory patterns are formed such that the second isolation layers protrude farther into the first opening than the memory patterns.

12. The method of claim 1, further comprising:
removing the mold patterns; and
forming blocking patterns that are located between the second isolation layers and the first isolation layers, separating the blocking patterns from each other.

13. The method of claim 12, wherein the forming of the blocking patterns comprises oxidizing the first material layers to form the blocking patterns.

14. The method of claim 1, further comprising:
forming a tunnel insulating layer in the first opening; and
forming a channel layer in the tunnel insulating layer.

15. A method of manufacturing a semiconductor device, the method comprising:
forming a stacked structure with first material layers and second material layers that are alternately stacked with each other;
forming a first opening that passes through the stacked structure;
forming first isolation layers on the second material layers, the first isolation layers protruding into the first opening;
forming mold patterns on the first material layers, protruding toward a center of the first opening, between the protruding portions of the first isolation layers;
forming third openings by partially etching the first isolation layers that are exposed between the mold patterns;
forming second isolation layers in the third openings, the second isolation layers including first curved surfaces that protrude toward the mold patterns and second curved surfaces that protrude farther towards a center of the first opening than the mold patterns;
removing the mold patterns to form fourth openings between the second isolation layers; and
forming memory patterns in the fourth openings sidewalls of the memory patterns facing portions of the first curved surfaces and the second curved surfaces of the second isolation layers.

16. The method of claim 15, wherein in the forming of the memory patterns, the memory patterns are formed to fill grooves between the first curved surfaces and the second curved surfaces.

17. The method of claim 15, further comprising forming blocking patterns by oxidizing the first material layers that are exposed by removing the mold patterns.

18. A semiconductor device, comprising:
a gate structure including conductive layers and insulating layers that are alternately stacked with each other;
a channel layer passing through the gate structure;
blocking patterns located between the channel layer and the conductive layers;
memory patterns located between the channel layer and the blocking patterns; and
isolation layers located between the channel layer and the insulating layers, each of the isolation layers including a first area with a first curved surface and a second area with a second curved surface,
wherein the second area has a smaller width than the first area,
wherein at least a portion of the second area protrudes farther toward the channel layer than the memory patterns, and
wherein the isolation layers are not connected to each other between the channel layer and the conductive layers.

19. The semiconductor device of claim 18, wherein each of the blocking patterns faces the first curved surface.

20. The semiconductor device of claim 18, wherein each of the memory patterns faces portions of the first curved surface and the second curved surface and fills a groove between the first curved surface and the second curved surface.

21. The semiconductor device of claim 18, wherein the isolation layers protrude into the gate structure toward the insulating layers.

22. The semiconductor device of claim 18, wherein the channel layer includes a curved surface that surrounds at least a portion of the second area that protrudes between the memory patterns.

23. The semiconductor device of claim 18, further comprising a tunnel insulating layer located between the channel layer and the memory patterns and between the channel layer and the isolation layers, the tunnel insulating layer with a curved surface that surrounds at least a portion of the second area that protrudes between the memory patterns.

* * * * *